US009490964B2

(12) United States Patent
Sengoku

(10) Patent No.: US 9,490,964 B2
(45) Date of Patent: Nov. 8, 2016

(54) SYMBOL TRANSITION CLOCKING CLOCK AND DATA RECOVERY TO SUPPRESS EXCESS CLOCK CAUSED BY SYMBOL GLITCH DURING STABLE SYMBOL PERIOD

(71) Applicant: QUALCOMM Incorporated, San Diego, CA (US)

(72) Inventor: Shoichiro Sengoku, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 17 days.

(21) Appl. No.: 14/555,097

(22) Filed: Nov. 26, 2014

(65) Prior Publication Data
US 2016/0149693 A1    May 26, 2016

(51) Int. Cl.
*H04L 27/10* (2006.01)
*H03D 13/00* (2006.01)
*H04L 7/00* (2006.01)
(Continued)

(52) U.S. Cl.
CPC ......... *H04L 7/0087* (2013.01); *G06F 13/4072* (2013.01); *G11C 8/06* (2013.01); *H04L 7/0037* (2013.01); *H04L 7/0083* (2013.01); *H04L 7/033* (2013.01); *H04L 7/042* (2013.01); *H04L 7/08* (2013.01); *H04L 25/14* (2013.01); *H04L 25/49* (2013.01)

(58) Field of Classification Search
CPC .... G06F 13/385; G06F 3/061; G06F 1/3296; G06F 1/3293; G06F 13/1668
USPC ............................................ 375/282; 327/40
See application file for complete search history.

(56) References Cited

U.S. PATENT DOCUMENTS 4,222,116 A * 9/1980 Groves ............... H04L 25/4904
375/282
4,397,042 A * 8/1983 Tsujii ...................... H04L 25/49
327/104
(Continued)

FOREIGN PATENT DOCUMENTS

GB      2064273 A    6/1981
GB      2178272 A    2/1987
(Continued)

OTHER PUBLICATIONS

International Search Report and Written Opinion—PCT/US2015/056991—ISA/EPO—Jan. 18, 2016.

*Primary Examiner* — Daniel Washburn
*Assistant Examiner* — Sarah Hassan
(74) *Attorney, Agent, or Firm* — Loza & Loza, LLP

(57) ABSTRACT

A method and an apparatus are provided. The apparatus may includes a clock recovery circuit having a comparator that provides a comparison signal indicating whether an input signal matches a level-latched instance of the input signal, a first set-reset latch that provides a filtered version of the comparison signal, where the first set-reset latch is set by a first-occurring active transition of the comparison signal and is unaffected by further transitions of the comparison signal that occur during a predefined period of time, delay circuitry that receives the filtered version of the comparison signal and outputs a first pulse on a first clock signal, and a second set-reset latch configured to provide a second pulse on an output clock signal when the first pulse is present on the first clock signal and the comparison signal indicates that the level-latched instance of the input signal does not match the input signal.

30 Claims, 26 Drawing Sheets

(51) Int. Cl.
  *H04L 7/04* (2006.01)
  *H04L 7/08* (2006.01)
  *G11C 8/06* (2006.01)
  *G06F 13/40* (2006.01)
  *H04L 7/033* (2006.01)
  *H04L 25/14* (2006.01)
  *H04L 25/49* (2006.01)

(56) References Cited

U.S. PATENT DOCUMENTS

| | | | | |
|---|---|---|---|---|
| 4,597,077 | A * | 6/1986 | Nelson | H04L 5/24 370/352 |
| 4,611,321 | A * | 9/1986 | Gabrielli | H04M 11/06 370/352 |
| 5,050,194 | A | 9/1991 | Pickering et al. | |
| 5,287,266 | A * | 2/1994 | Malec | B62B 3/1408 340/3.3 |
| 5,640,433 | A * | 6/1997 | Szczebak, Jr. | H04M 3/22 375/220 |
| 5,917,340 | A * | 6/1999 | Manohar | H03K 19/09425 326/27 |
| 6,353,341 | B1 | 3/2002 | Lesea et al. | |
| 6,900,676 | B1 | 5/2005 | Tamura | |
| 8,483,579 | B2 | 7/2013 | Fukuda | |
| 2001/0048630 | A1 * | 12/2001 | Fujimoto | G11C 8/06 365/230.03 |
| 2003/0085739 | A1 * | 5/2003 | Totsuka | H03L 7/087 327/40 |
| 2004/0057544 | A1 * | 3/2004 | Fernald | H03K 3/0231 375/362 |
| 2009/0122852 | A1 * | 5/2009 | Smith | G01R 13/0218 375/228 |
| 2010/0052751 | A1 * | 3/2010 | Abe | G11C 7/1051 327/158 |
| 2011/0176646 | A1 * | 7/2011 | Pal | H04L 7/0331 375/354 |
| 2011/0249781 | A1 * | 10/2011 | Guillot | H03L 7/091 375/354 |
| 2012/0033774 | A1 * | 2/2012 | Tanaka | H03L 7/07 375/371 |
| 2012/0049910 | A1 | 3/2012 | Aoyama | |
| 2013/0070882 | A1 | 3/2013 | Nedovic | |
| 2014/0153665 | A1 | 6/2014 | Wiley et al. | |

FOREIGN PATENT DOCUMENTS

WO  WO-2014150984 A1  9/2014
WO  WO-2014153472 A1  9/2014

* cited by examiner

SYMBOL TRANSITION CLOCKING CLOCK AND DATA RECOVERY TO SUPPRESS EXCESS CLOCK CAUSED BY SYMBOL GLITCH DURING STABLE SYMBOL PERIOD

TECHNICAL FIELD

The present disclosure relates generally to communication systems, and more particularly, to clock and data recovery from a multi-wire interface that is subject to transients affecting signaling state of one or more wires.

BACKGROUND

Manufacturers of mobile devices, such as cellular phones, may obtain components of the mobile devices from various sources, including different manufacturers. For example, an application processor in a cellular phone may be obtained from a first manufacturer, while the display for the cellular phone may be obtained from a second manufacturer. The application processor and a display or other device may be interconnected using a standards-based or proprietary physical interface. For example, a display may provide an interface that conforms to the Display System Interface (DSI) standard specified by the Mobile Industry Processor Interface Alliance (MIPI).

In one example, a multi-signal data transfer system may employ multi-wire differential signaling such as three-phase or N-factorial (N!) low-voltage differential signaling (LVDS), transcoding (e.g., the digital-to-digital data conversion of one encoding type to another) may be performed to embed symbol clock information by causing a symbol transition at every symbol cycle, instead of sending clock information in separate data lanes (differential transmission paths). Embedding clock information by transcoding is an effective way to minimize skew between clock and data signals, as well as to eliminate the necessity of a phase-locked loop (PLL) to recover the clock information from the data signals.

In another example, MIPI standards define a camera control interface (CCI) that uses a two-wire, bi-directional, half duplex, serial interface configured as a bus connecting a master and one or more slaves. Conventional CCI is compatible with a protocol used in a variant of the Inter-Integrated Circuit (I2C) bus and is capable of handling multiple slaves on the bus, with a single master. The CCI bus may include Serial Clock (SCL) and Serial Data (SDA) lines. CCI devices and I2C devices can be deployed on the same bus such that two or more CCI devices may communicate using CCI protocols, while any communication involving an I2C bus uses I2C protocols. Later versions of CCI can provide higher throughputs using modified protocols to support faster signaling rates. A CCI extension (CCIe) bus may be used to provide higher data rates for devices that are compatible with CCIe bus operations. Such devices may be referred to as CCIe devices, and the CCIe devices can attain higher data rates when communicating with each other by encoding data as symbols transmitted on both the SCL line and the SDA line of a conventional CCI bus. CCIe devices and I2C devices may coexist on the same CCIe bus, such that in a first time interval, data may be transmitted using CCIe encoding and other data may be transmitted in a different time interval according to I2C signaling conventions.

The capabilities and functionality of mobile devices continues to grow and there is a resultant demand for ever-increasing bandwidth between components within mobile devices and the like. Accordingly, there exists an ongoing need for optimized communications in general and improved reliability of data transfer on multi-signal wire communication links.

SUMMARY

In an aspect of the disclosure, a method, a computer program product, and an apparatus are provided that can filter or suppress the effects of glitches in signals received from a multi-wire interface.

In various aspects, an apparatus includes a clock recovery circuit. The clock recovery circuit may include a comparator configured to provide a comparison signal indicating whether an input signal matches a level-latched instance of the input signal, a first set-reset latch that provides a filtered version of the comparison signal, delay circuitry that receives the filtered version of the comparison signal and outputs a first pulse on a first clock signal, and a second set-reset latch configured to provide a second pulse on an output clock signal when the first pulse is present on the first clock signal and the comparison signal indicates that the level-latched instance of the input signal does not match the input signal. The first set-reset latch may be set by a first-occurring active transition of the comparison signal, and may be unaffected by further transitions of the comparison signal that occur during a predefined period of time. The second set-reset latch may be reset when no pulse is present on the first clock signal. The second set-reset latch may be configured to ignore pulses on the first clock signal that occur when the comparison signal indicates that the level-latched instance of the input signal matches the input signal. The input signal may represent signaling state on a plurality of signal wires. A level latch receives the input signal and outputs the level-latched instance of the input signal. The level latch may be triggered by the first pulse or a derivative of the first pulse.

In one aspect, data may be encoded in a sequence of symbols transmitted on the plurality of signal wires. Clock information may be embedded in transitions between symbols in the sequence of symbols. The plurality of signal wires may include at least three signal wires. Each combination of two wires in the at least three signal wires may be driven by a differential driver that is different from differential drivers that drive other available combinations of two wires in the at least three signal wires.

In one aspect, a third set-reset latch is configured to produce an extendable pulse on a third clock signal. The extendable pulse may be derived from the first pulse and may be extended when the first pulse occurs while the comparison signal indicates that the input signal does not match the level-latched instance of the input signal. The extendable pulse may be extended until the comparison signal indicates that the input signal matches the level-latched instance of the input signal. A level latch may receive the input signal and output the level-latched instance of the input signal. The level latch is triggered by the extendable pulse.

In one aspect, the delay circuitry includes one-shot logic that generates a third pulse in response to a transition on the filtered version of the comparison signal, and a delay element that delays the third pulse to obtain the first pulse.

In various aspects, a method for recovering a clock signal includes generating a comparison signal indicating whether an input signal matches a level-latched instance of the input signal, filtering the comparison signal to obtain a filtered version of the comparison signal, providing a first pulse on a first clock signal in response to a transition on the filtered version of the comparison signal, providing a second pulse on an output clock signal when the first pulse is present on the first clock signal and the comparison signal indicates that the level-latched instance of the input signal does not match the input signal, and ignoring the first pulse when the comparison signal indicates that the level-latched instance of the input signal matches the input signal. The input signal may represent signaling state on a plurality of signal wires. Filtering the comparison signal may include setting a first set-reset latch using a first-occurring active transition of the comparison signal, and ignoring further transitions of the comparison signal that occur during a predefined period of time. The first pulse or a derivative thereof may reset the first set-reset latch.

In one aspect, data words may be encoded in sequences of symbols transmitted on the plurality of signal wires. Clock information may be embedded in transitions between symbols in the sequences of symbols. The plurality of signal wires may include at least three signal wires. Each combination of two wires in the at least three signal wires may be driven by a differential driver that is different from differential drivers that drive other available combinations of two wires in the at least three signal wires.

In one aspect, providing a second pulse on an output clock signal includes setting a second set-reset latch when the first pulse is present on the first clock signal and the comparison signal indicates that the level-latched instance of the input signal does not match the input signal, and resetting the second set-reset latch when no pulse is present on the first clock signal.

In one aspect, an extended instance of the first pulse may be generated when the first pulse occurs while the comparison signal indicates that the input signal does not match the level-latched instance of the input signal, and the level-latched instance of the input signal may be updated to match the input signal by capturing the input signal using the extended instance of the first pulse. The extended instance of the first pulse may be extended until the comparison signal indicates that the input signal matches the level-latched instance of the input signal. Updating the level-latched instance of the input signal may include using the extended instance of the first pulse to trigger a level latch that receives the input signal and outputs the level-latched instance of the input signal.

In one aspect, the first pulse may be used to trigger a level latch that receives the input signal and outputs the level-latched instance of the input signal. The first pulse may be provided on the first clock signal by generating a third pulse having a predetermined duration in response to a transition on the filtered version of the comparison signal, and delaying the third pulse to obtain the first pulse.

DETAILED DESCRIPTION

Figure 1:
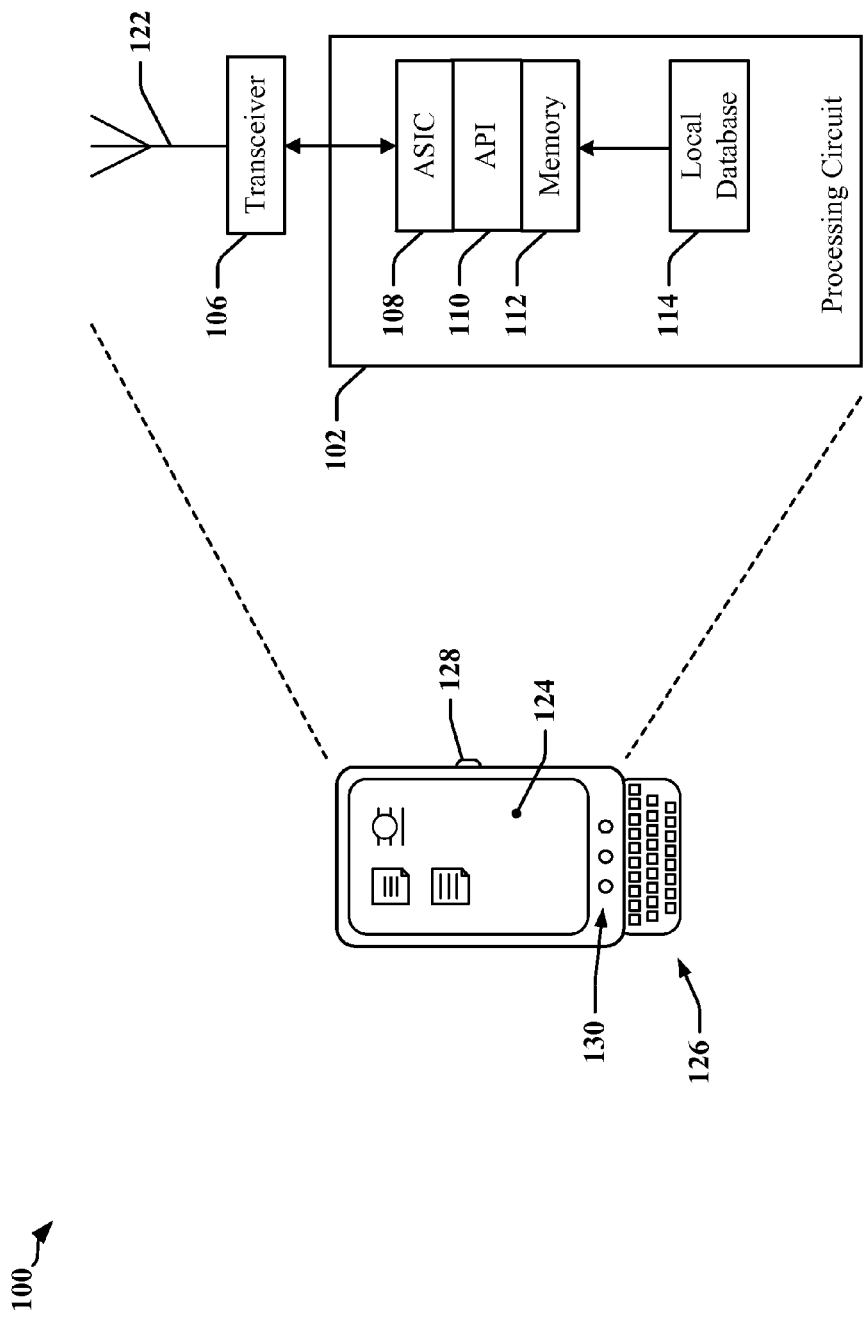
FIG. 1 depicts an apparatus employing a data link between integrated circuit (IC) devices that selectively operates according to one of plurality of available standards.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), and floppy disk where disks usually reproduce data magnetically, while discs reproduce data optically with lasers. Combinations of the above should also be included within the scope of computer-readable media.

FIG. 1 depicts an apparatus that may employ a communication link between IC devices. In one example, the apparatus 100 may include a wireless communication device that communicates through an RF transceiver with a radio access network (RAN), a core access network, the Internet and/or another network. The apparatus 100 may include a communications transceiver 106 operably coupled to processing circuit 102. The processing circuit 102 may include one or more IC devices, such as an application-specific IC (ASIC) 108. The ASIC 108 may include one or more processing devices, logic circuits, and so on. The processing circuit 102 may include and/or be coupled to processor readable storage such as a memory 112 that can maintain data and instructions that may be executed by processing circuit 102. The processing circuit 102 may be controlled by one or more of an operating system and an application programming interface (API) 110 layer that supports and enables execution of software modules residing in storage media, such as the memory device 112 of the wireless device. The memory device 112 may include read-only memory (ROM) or random-access memory (RAM), electrically erasable programmable ROM (EEPROM), flash cards, or any memory device that can be used in processing systems and computing platforms. The processing circuit 102 may include or access a local database 114 that can maintain operational parameters and other information used to configure and operate the apparatus 100. The local database 114 may be implemented using one or more of a database module, flash memory, magnetic media, EEPROM, optical media, tape, soft or hard disk, or the like. The processing circuit may also be operably coupled to external devices such as an antenna 122, a display 124, operator controls, such as button 128 and keypad 126 among other components.

Figure 2:
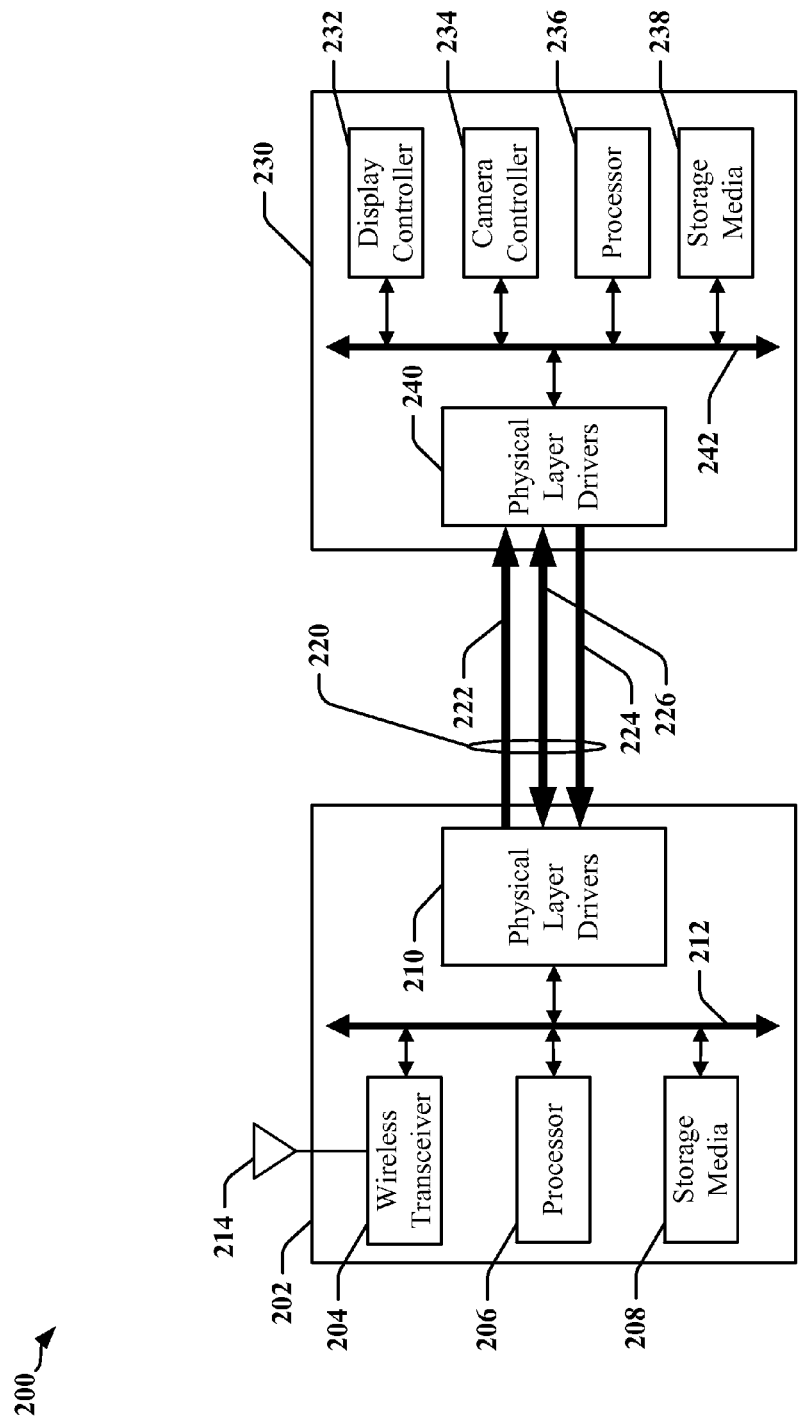
FIG. 2 illustrates a system architecture for an apparatus employing a data link between IC devices.

FIG. 2 is a block schematic illustrating certain aspects of an apparatus 200 such as a mobile apparatus that employs a communication link 220 to connect various subcomponents. In one example, the apparatus 200 includes a plurality of IC devices 202 and 230 that exchange data and control information through a communication link 220. The communication link 220 may be used to connect IC devices 202 and 222 that are located in close proximity to one another, or physically located in different parts of the apparatus 200. In one example, the communication link 220 may be provided on a chip carrier, substrate or circuit board that carries the IC devices 202 and 230. In another example, a first IC device 202 may be located in a keypad section of a mobile computing device while a second IC device 230 may be located in a display section of mobile computing device. In another example, a portion of the communication link 220 may include a cable or optical connection.

The communication link 220 may provide multiple channels 222, 224 and 226. One or more channels 226 may be bidirectional, and may operate in half-duplex and/or full-duplex modes. One or more channels 222 and 224 may be unidirectional. The communication link 220 may be asymmetrical, providing higher bandwidth in one direction. In one example described herein, a first communications channel 222 may be referred to as a forward link 222 while a second communications channel 224 may be referred to as a reverse link 224. The first IC device 202 may be designated as a host system or transmitter, while the second IC device 230 may be designated as a client system or receiver, even if both IC devices 202 and 230 are configured to transmit and receive on the communications link 222. In one example, the forward link 222 may operate at a higher data rate when communicating data from a first IC device 202 to a second IC device 230, while the reverse link 224 may operate at a lower data rate when communicating data from the second IC device 230 to the first IC device 202.

The IC devices 202 and 230 may each have a processor or other processing and/or computing circuit or device 206, 236. In one example, the first IC device 202 may perform core functions of the apparatus 200, including maintaining wireless communications through a wireless transceiver 204 and an antenna 214, while the second IC device 230 may support a user interface that manages or operates a display controller 232. In the example, the second IC device 230 may be adapted to control operations of a camera or video input device using a camera controller 234. Other features supported by one or more of the IC devices 202 and 230 may include a keyboard, a voice-recognition component, and other input or output devices. The display controller 232 may include circuits and software drivers that support displays such as a liquid crystal display (LCD) panel, touch-screen display, indicators and so on. The storage media 208 and 238 may include transitory and/or non-transitory storage devices adapted to maintain instructions and data used by respective processors 206 and 236, and/or other components of the IC devices 202 and 230. Communication between each processor 206, 236 and its corresponding storage media 208 and 238 and other modules and circuits may be facilitated by one or more bus 212 and 242, respectively.

The reverse link 224 may be operated in the same manner as the forward link 222, and the forward link 222 and reverse link 224 may be capable of transmitting at comparable speeds or at different speeds, where speed may be expressed as data transfer rate and/or clocking rates. The forward and reverse data rates may be substantially the same or differ by orders of magnitude, depending on the application. In some applications, a single bidirectional link 226 may support communications between the first IC device 202 and the second IC device 230. The forward link 222 and/or reverse link 224 may be configurable to operate in a bidirectional mode when, for example, the forward and reverse links 222 and 224 share the same physical connections and operate in a half-duplex manner. In one example, the communication link 220 may be operated to communicate control, command and other information between the first IC device 202 and the second IC device 230 in accordance with an industry or other standard.

In one example, forward and reverse links 222 and 224 may be configured or adapted to support a wide video graphics array (WVGA) 80 frames per second LCD driver IC without a frame buffer, delivering pixel data at 810 Mbps for display refresh. In another example, forward and reverse links 222 and 224 may be configured or adapted to enable communications between with dynamic random access memory (DRAM), such as double data rate synchronous dynamic random access memory (SDRAM). Encoding devices 210 and/or 230 can encode multiple bits per clock transition, and multiple sets of wires can be used to transmit and receive data from the SDRAM, control signals, address signals, and so on.

The forward and reverse links 222 and 224 may comply with, or be compatible with application-specific industry standards. In one example, the MIPI standard defines physical layer interfaces between an application processor IC device 202 and an IC device 230 that supports the camera or display in a mobile device. The MIPI standard includes specifications that govern the operational characteristics of products that comply with MIPI specifications for mobile devices. In some instances, the MIPI standard may define interfaces that employ complimentary metal-oxide-semiconductor (CMOS) parallel busses.

The communication link 220 of FIG. 2 may be implemented as a wired bus that includes a plurality of signal wires (denoted as N wires). The N wires may be configured to carry data encoded in symbols, where clock information is embedded in a sequence of the symbols transmitted over the plurality of wires. Examples of encoding techniques used with N-wire interfaces include N-factorial (N!) encoding, and N-phase encoding.

N! Encoding

Figure 3:
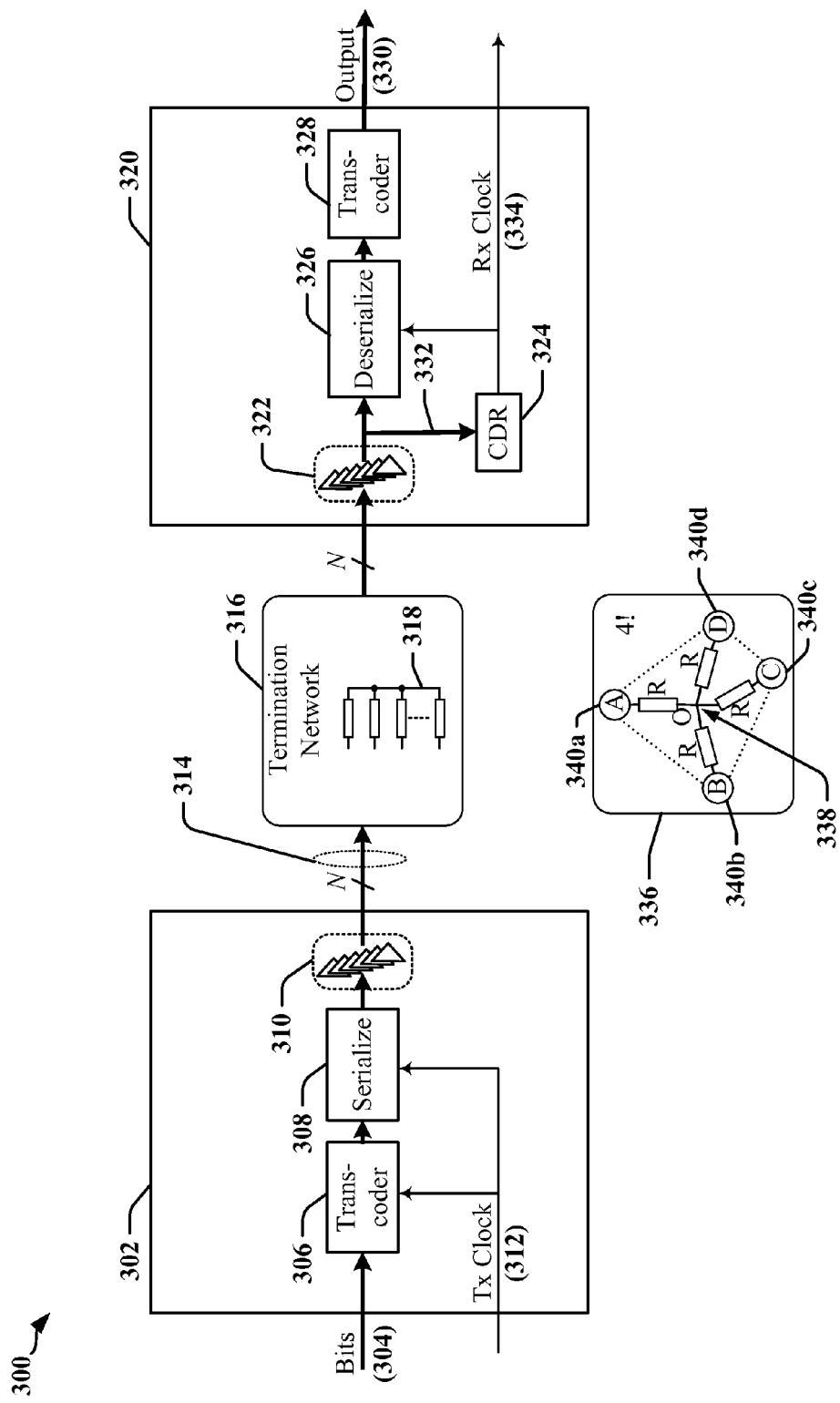
FIG. 3 illustrates an example of a basic N! multi-wire interface.

FIG. 3 is a diagram illustrating an example of N! encoding used on an N-wire interface 300 provided between two devices 302 and 320. At a transmitter 302, a transcoder 306 may be used to encode data 304 and clock information in symbols to be transmitted over a set of N wires 314. In an N! encoded interface, the clock information may be derived from a transmit clock 312 and may be encoded in a sequence of symbols transmitted in $_NC_2$ differential signals over the N wires 314 by ensuring that a signaling state transition occurs on at least one of the $_NC_2$ signals between consecutive symbols. When N! encoding is used to drive the N wires 314, each bit of a symbol is transmitted as a differential signal by one of a set of differential line drivers 310, where the differential drivers in the set of line drivers 310 are coupled to different pairs of the N wires 314. Each wire of the N wires 314 may be paired with each of the other N−1 wires in the N wires 314, and the number of available combinations of wire pairs ($_NC_2$) determines the number of signals that can be transmitted over the N wires 314. The number of data bits 304 that can be encoded in a symbol may be calculated based on the number of available signaling states available for each symbol transmission interval.

A termination impedance (typically resistive) couples each of the N wires 314 to a common center point 318 in a termination network 316. It will be appreciated that the signaling state of the N wires 314 reflects a combination of the currents in the termination network 316 attributed to the differential drivers 310 coupled to each wire. It will be further appreciated that the center point 318 is a null point, whereby the currents in the termination network 316 cancel each other at the center point 318. In one example, each of the 4 wires in a 4! interface is connected to a terminal 340a, 340b, 340c, 340d of a termination network 336. Each terminal 340a, 340b, 340c, 340d is coupled by a termination resistor to a center point 338 of the termination network 336.

An N! encoding scheme need not use a separate clock channel and/or non-return-to-zero decoding because at least one of the $_NC_2$ signals in the link transitions between consecutive symbols. Effectively, the transcoder 306 ensures that a transition occurs between each pair of symbols transmitted on the N wires 314 by producing a sequence of symbols in which signaling states of the N wires 314 changes between consecutively transmitted symbols. In the example depicted in FIG. 3, four wires are provided (N=4), and the 4 wires can carry $_4C_2$=6 differential signals. The transcoder 306 may employ a mapping scheme to generate raw symbols for transmission on the N wires 314. The transcoder 306 may map data bits 304 to a set of transition numbers. The transition numbers may be used to select raw symbols for transmission based on the value of the immediately preceding symbol such that the selected raw symbol is different from the preceding raw symbol. The raw symbols may be serialized by the serializers 308 to obtain a sequence of symbols for transmission over the N-wires 314. In one example, a transition number may be used to lookup a data value corresponding to the second of the consecutive raw symbols with reference to the first of the consecutive raw symbols. At the receiver 320, a transcoder 328 may employ a mapping to determine a transition number that characterizes a difference between a pair of consecutive raw symbols, using a lookup table for example. The transcoders 306, 328 operate on the basis that every consecutive pair of raw symbols includes two different symbols.

The transcoder 306 at the transmitter 302 may select between N!−1 available signaling states at every symbol transition. In one example, a 4! system provides 4!−1=23 signaling states for the next symbol to be transmitted at each symbol transition. The bit rate may be calculated as $\log_2$ (available_states) per transmit clock cycle.

According to certain aspects disclosed herein, dual data rate (DDR) signaling may be employed to increase the interface bandwidth by transmitting two symbols in each period of the transmit clock 312. Symbol transitions occur at both the rising edge and falling edge of the transmit clock in a system using double data rate (DDR) clocking. The total available states in the transmit clock cycle is $(_NC_2-1)2=(23)2=529$ and the number of data bits 304 that can transmitted per symbol may be calculated as $\log_2(529)=9.047$ bits.

A receiving device 320 receives the sequence of symbols using a set of line receivers 322 where each receiver in the set of line receivers 322 determines differences in signaling states on one pair of the N wires 314. Accordingly, $_NC_2$ receivers 322 are used, where N represents the number of wires. The $_NC_2$ receivers 322 produce a corresponding number of raw symbols as outputs. In the 4-wire example, the signals received on the 4 wires 314 are processed by 6 receivers ($_4C_2=6$) to produce a raw symbol signal 332 that is provided to a clock and data recovery (CDR) circuit 324 and deserializers 326. The raw symbol signal 332 is representative of the signaling state of the N wires 314, and the CDR circuit 324 may process the raw symbol signal 332 to generate a receive clock signal 334 that can be used by the deserializer 326.

The receive clock signal 334 may be a DDR clock signal that can be used by external circuitry to process received data 330 provided by the transcoder 328. The transcoder 328 decodes a block of received symbols from the deserializer 326 by comparing each symbol to its immediate predecessor. The transcoder 328 produces output data 330 corresponding to the data 304, provided to the transmitter 302.

Figure 4:
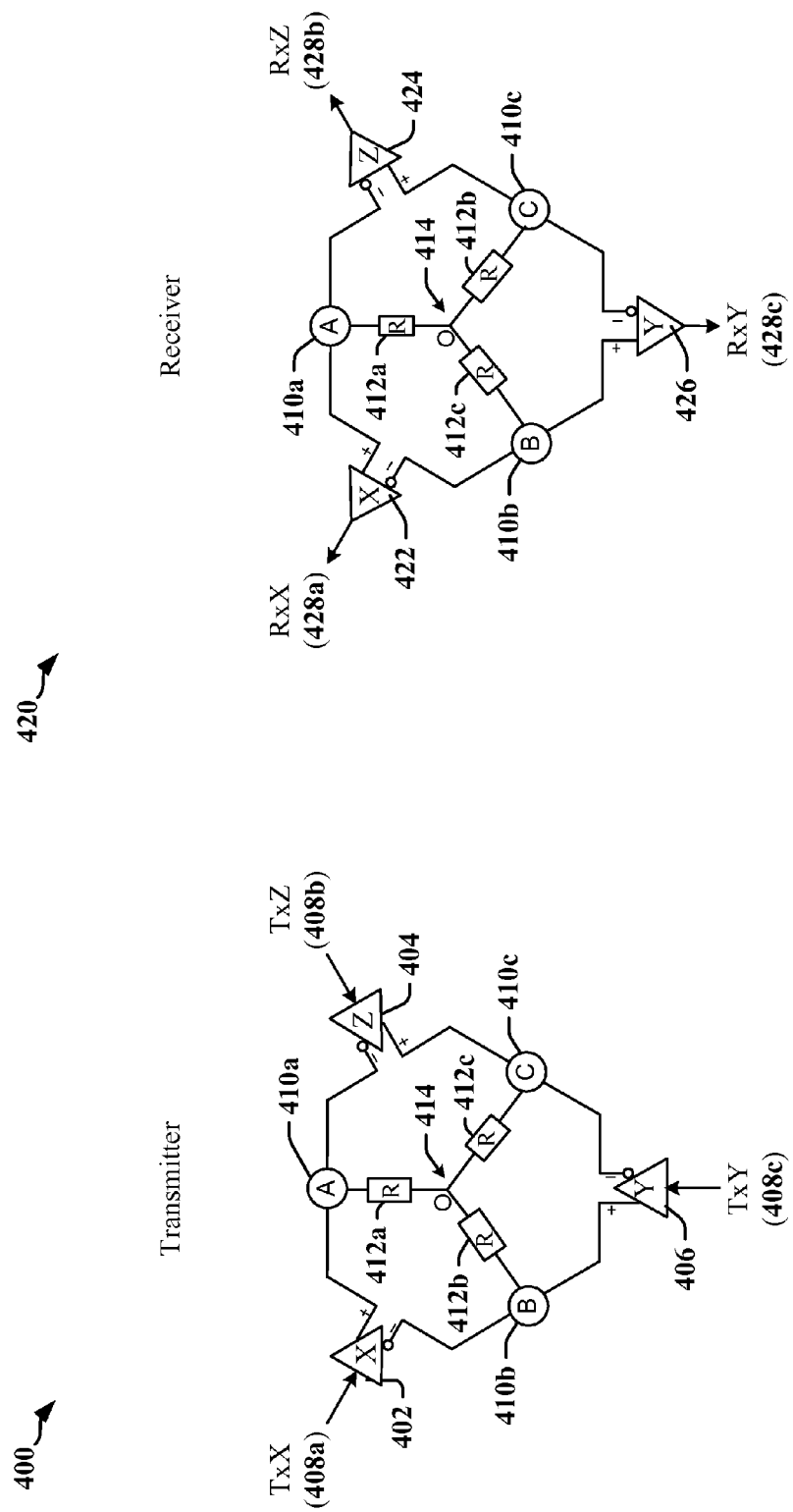
FIG. 4 illustrates an example of a termination network employed in a three-wire, 3! communications interface.

FIG. 4 illustrates an example of a termination network employed in a three-wire, 3! communications interface, where one view of the termination network is provided from the perspective of a transmitter 400, and another view of the termination network is provided from the perspective of a receiver 420. The termination network includes three resistors 412a, 412b and 412c having a value of R Ω, and which couple the network terminals 410a, 410b and 412c, respectively, to a center point 414. On the transmitter side 400, differential line drivers 402, 404 and 406 drive different pairs of the three terminals 410a, 410b and 410c. Each differential line driver 402, 404, and 406 responds to its respective input signal 408a, 408b or 408c by providing a current that flows through a pair of the three resistors 412a, 412b and 412c of the termination network. Accordingly, each differential line driver 402, 404, 406 sees an impedance of 2R Ω, where R is typically chosen to match the characteristic impedance of a transmission line coupled to the termination network. The transmission line may include two wires of the three-wire interface driven by the differential line driver 402, 404 or 406. The voltage observed by the line receivers 422, 424, 426 may be calculated based on the sum of the currents flowing through the two resistors 412a, 412b and/or 412c that span the pair of terminals 410a, 410b and/or 410c coupled to a corresponding line receiver 422, 424 or 426.

Figure 5:
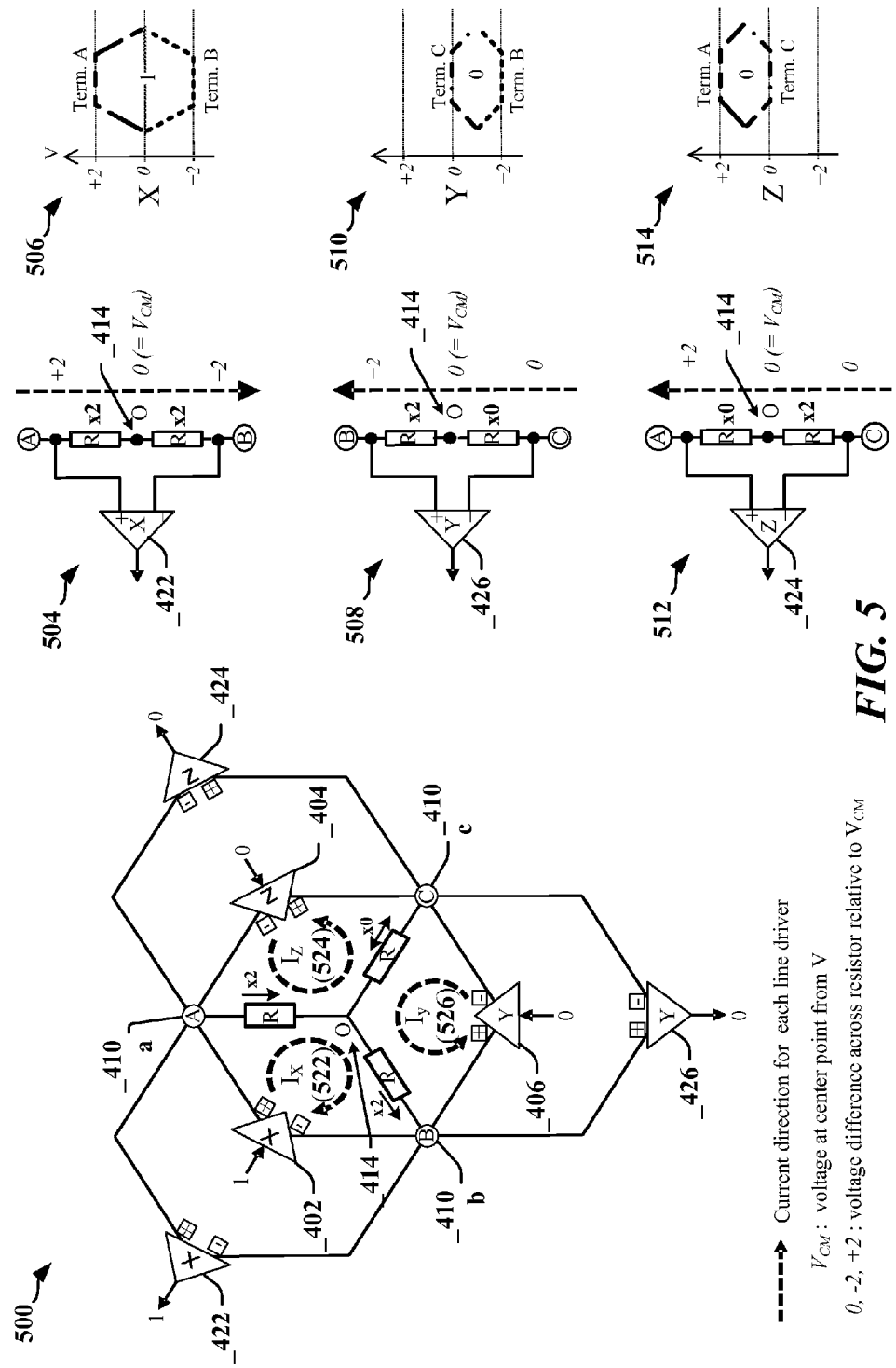
FIG. 5 illustrates an example of current flow in the termination network for the three-wire, 3! communications interface illustrated in FIG. 4.

FIG. 5 illustrates an example of current flow in the termination network for the three-wire, 3! communications interface illustrated in FIG. 4. FIG. 5 provides a schematic diagram 500 showing the relationship between the differential line drivers 402, 404, 406, the receivers 422, 424, 426 and the currents flowing through the resistors of the termination network. In the example, a raw symbol value of 100 is being transmitted, such that the X line driver 402 transmits the most significant bit of the raw symbol. The current 522 provided by the X line driver 402 in response to a logic '1' input flows in a first direction through the termination network from terminal A 410a to terminal B 410b. The current 526 provided by the Y line driver 406 in response to a logic '0' input flows in a second direction through the termination network from terminal C 410c to terminal B 410b. The current 524 provided by the Z line driver 404 in response to a logic '0' input flows in the second direction through the termination network from terminal A 410a to terminal C 410c. The resultant current flowing through each resistor is calculated as the sum of two current flows 522, 524 and/or 526. In each resistor, substantially no current flows or twice the current ($I_{TX}$) produced by a single differential line driver 402, 404 or 406 flows in the resistor.

As shown in isolation in the schematic drawings 504, 508 and 512, each receiving circuit 422, 424, 426 receives a voltage input from two terminals 410a, 410b and/or 410c where each voltage input reflects a voltage level that may be measured with respect to the center point 414 of the termination network. Each voltage level can be $\pm 2I_{TX}R$ Volts or 0 Volts, for example. The receiving circuits 422, 424, 426 may generate a logic '1' output state or a logic '0' output state based on the polarity of the voltage differences across a corresponding pair of the terminals 410a, 410b and/or 410c.

Figure 6:
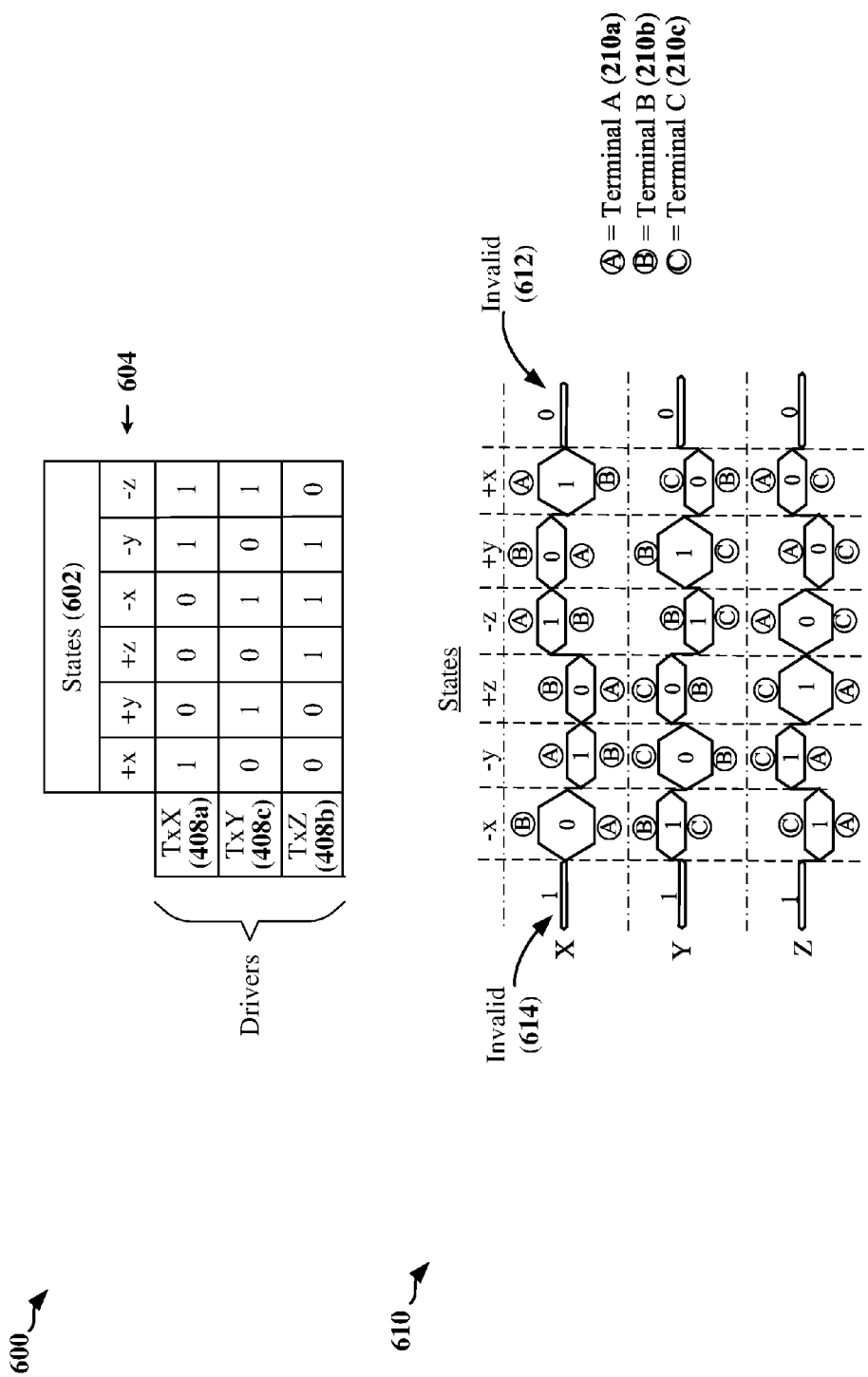
FIG. 6 illustrates certain aspects of the operation of the three-wire, 3! communications interface illustrated in FIGS. 4 and 5.

FIG. 6 illustrates certain aspects of the operation of the three-wire, 3! communications interface illustrated in FIGS. 4 and 5. As illustrated in the state table 600, six signaling states 602 of the 3 wires may be used to encode information. The signaling states 602 are defined by three bits (see 408a, 408b and 408c) of a raw input symbol provided to the differential line drivers 402, 404, 406 respectively. Each combination of inputs to the differential line drivers 402, 404, 406 generates a unique set of differential signals, except for the states 612, 614 when all inputs are 000 or 111. The input combinations 000 or 111 are considered invalid because they produce a zero voltage differential and cannot be distinguished from one another at a receiver. The remaining combinations of inputs may be referred to as states +x, +y, +z, −x, −y, and −z as illustrated in the state table 600.

The signaling states measureable at the 3 terminals 410a, 410b and 410c are illustrated in the graph 610. The output of a receiver 422, 424, or 426 represents the polarity difference between the two terminals 410a, 410b and/or 410c coupled to the receiver 422, 424, or 426.

In operation, the 3! interface can use a total of six (6) states: 001 (+z), 010 (+y), 100 (+x), 110 (−z), 101 (−y), 011 (−x), which are transferred over the 3 wires. Accordingly, $\log_2(6)=2.58$ bits of information can be encoded per cycle.

N-Phase Encoding

Figure 7:
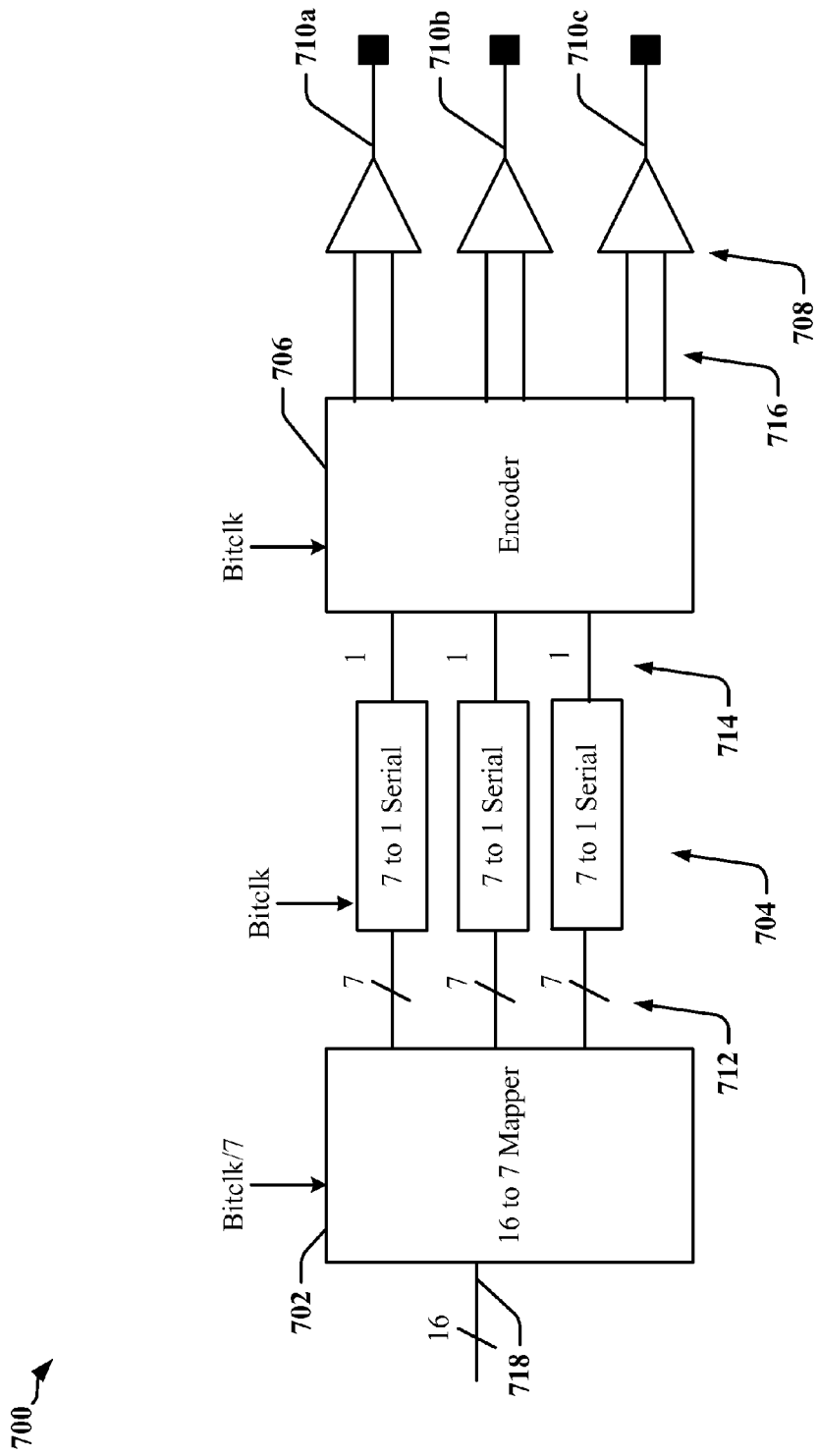
FIG. 7 illustrates an example of a three-wire, three-phase polarity data encoder.

Certain other multi-wire interfaces use N-phase encoding to transmit data over a plurality of wires. FIG. 7 is a diagram 700 illustrating an example of a three-wire, N-phase polarity encoding transmitter configured for N=3. The principles and techniques disclosed for three-wire, three-phase encoders can be applied to other N-phase polarity encoders that support other configurations and numbers of wires.

When three-phase polarity encoding is used, connectors such as signal wires 710a, 710b and 710c on a three-wire bus may be undriven, driven positive, or driven negative. An undriven signal wire 710a, 710b or 710c may be in a high-impedance state. An undriven signal wire 710a, 710b or 710c may be at least partially pulled or driven towards a voltage level that lies substantially halfway between the positive and negative voltage levels provided on driven signal wires. An undriven signal wire 710a, 710b or 710c may have substantially no current flowing through it. In the example illustrated in FIG. 7, a set of drivers 708 may control the state of each signal wire 710a, 710b and 710c for each symbol transmission interval, such that each signal wire 710a, 710b and 710c may be in one of three states (denoted as +1, −1, and 0) for a transmitted symbol. In one example, drivers 708 may include unit-level current-mode drivers. In another example, drivers 708 may drive opposite polarity voltages on two signals 710a and 710b while the third signal 710c is at high impedance and/or pulled to ground. For each symbol transmission interval, at least one signal is in the undriven (0) state, while the number of signals driven positive (+1 state) is equal to the number of signals driven negative (−1 state), such that the sum of current flowing to the receiver is always zero. For each pair of consecutive symbol transmission intervals, at least one signal wire 710a, 710b or 710c has a different state in the two symbol transmission intervals.

In the example depicted in FIG. 7, 16-bit data 718 is input to a mapper 702, which maps the input data 718 to 7 symbols 712 for transmitting sequentially over the signal wires 710a, 710b and 710c. The 7 symbols 712 may be serialized, using parallel-to-serial converters 704 for example. A three-wire, three-phase encoder 706 receives 7 symbols 712 produced by the mapper one symbol at a time and computes the state of each signal wire 710a, 710b and 710c for each symbol interval. The encoder 706 selects the states of the signal wires 710a, 710b and 710c based on the input symbol and the previous states of signal wires 710a, 710b and 710c.

The use of N-phase encoding permits a number of bits to be encoded in a plurality of symbols where the bits per symbol is not an integer. In the simple example of a three-wire system, there are 3 available combinations of 2 wires that may be driven simultaneously, and 2 possible combinations of polarity on the pair of simultaneously driven wires, yielding 6 possible states. Since each transition occurs from a current state, 5 of the 6 states are available at every transition. The state of at least one wire is required to change at each transition. With 5 states, $\log_2(5) \approx 2.32$ bits may be encoded per symbol. Accordingly, a mapper may accept a 16-bit word and convert it to 7 symbols because 7 symbols carrying 2.32 bits per symbol can encode 16.24 bits. In other words, a combination of seven symbols that encodes five states has 5$^7$ (78,125) permutations. Accordingly, the 7 symbols may be used to encode the 2$^{16}$ (65,536) permutations of 16 bits.

Figure 8:
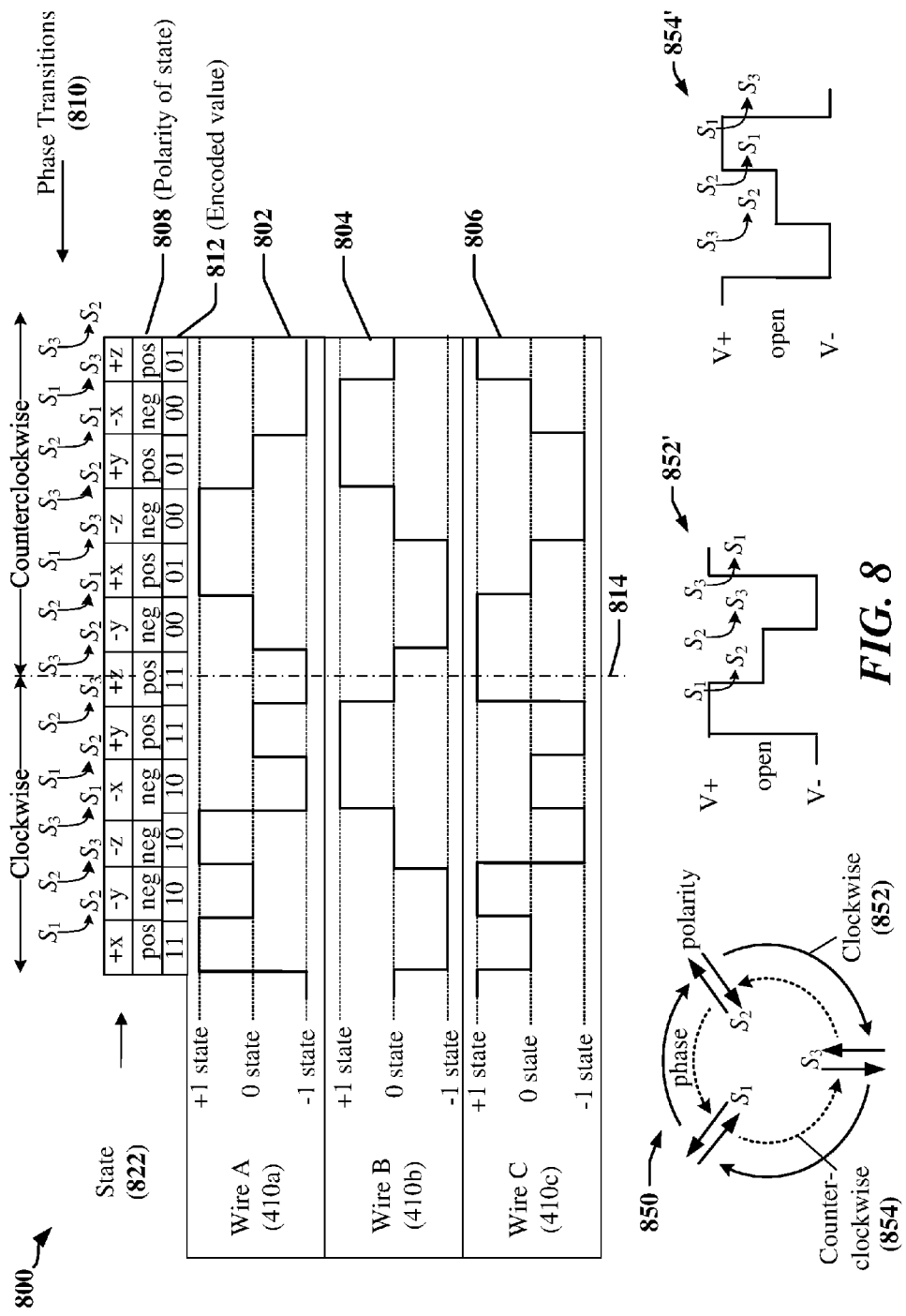
FIG. 8 illustrates signaling in a three-wire, three-phase polarity encoded interface.

FIG. 8 illustrates an example of signaling 800 employing a three-phase modulation data-encoding scheme based on the circular state transition diagram 850. According to the data-encoding scheme, a three-phase signal may rotate in two directions and may be transmitted on three conductors 710a, 710b and 710c. Each of the three signals is independently driven on the conductors 710a, 710b, 710c. Each of the three signals includes the three-phase signal, with the signal on each conductor 710a, 710b and 710c being 120 degrees out of phase relative to the signals on the other two conductors 710a, 710b and 710c. At any point in time, each of the three conductors 710a, 710b, 710c is in a different one of the states {+1, 0, −1}. At any point in time, each of the three conductors 710a, 710b, 710c in a three-wire system is in a different state than the other two wires. However, when more than three conductors or wires are used, two or more pairs of wires may be in the same state. The illustrated encoding scheme also encodes information in the polarity of the two conductors 710a, 710b and/or 710c that are actively driven to the +1 and −1 states. Polarity is indicated at 808 for the sequence of states depicted.

At any phase state in the illustrated three-wire example, exactly two of the conductors 710a, 710b, 710c carry a signal which is effectively a differential signal for that phase state, while the third conductor 710a, 710b or 710c is undriven. The phase state for each conductor 710a, 710b, 710c may be determined by voltage difference between the conductor 710a, 710b or 710c and at least one other conductor 710a, 710b and/or 710c, or by the direction of current flow, or lack of current flow, in the conductor 710a, 710b or 710c. As shown in the state transition diagram 850, three phase states ($S_1$, $S_2$ and $S_3$) are defined. A signal may flow clockwise from phase state $S_1$ to phase state $S_2$, phase state $S_2$ to phase state $S_3$, and/or phase state $S_3$ to phase state $S_1$ and the signal may flow counter-clockwise from phase state $S_1$ to phase state $S_3$, phase state $S_3$ to phase state $S_2$, and/or phase state $S_2$ to phase state $S_1$. For other values of N, transitions between the N states may optionally be defined according to a corresponding state diagram to obtain circular rotation between state transitions.

In the example of a three-wire, three-phase communications link, clockwise rotations ($S_1$ to $S_2$), ($S_2$ to $S_3$), and/or ($S_3$ to $S_1$) at a state transition may be used to encode a logic 1, while counter-clockwise rotations ($S_1$ to $S_3$), ($S_3$ to $S_2$), and/or ($S_2$ to $S_1$) at the state transition may be used to encode a logic 0. Accordingly a bit may be encoded at each transition by controlling whether the signal is "rotating" clockwise or counter-clockwise. For example, a logic 1 may be encoded when the three wires 710a, 710b, 710c transition from phase state $S_1$ to phase state $S_2$ and a logic 0 may be encoded when the three wires 710a, 710b, 710c transition from phase state St to phase state $S_3$. In the simple three-wire example depicted, direction of rotation may be easily determined based on which of the three wires 710a, 710b, 710c is undriven before and after the transition.

Information may also be encoded in the polarity of the driven conductors 710a, 710b, 710c or direction of current flow between two conductors 710a, 710b, 710c. Signals 802, 804, and 806 illustrate voltage levels applied to conductors 710a, 710b, 710c, respectively at each phase state in a three-wire, three-phase link. At any time, a first conductor 710a, 710b, 710c is coupled to a positive voltage (+V, for example), a second conductor 710a, 710b, 710c is coupled to a negative voltage (−V, for example), while the third conductor 710a, 710b, 710c may be open-circuited or otherwise undriven. As such, one polarity encoding state may be determined by the current flow between the first and second conductors 710a, 710b, 710c or the voltage polarities of the first and second conductors 710a, 710b, 710c. In some embodiments, two bits of data may be encoded at each phase transition. A decoder may determine the direction of signal phase rotation to obtain the first bit, and the second bit may be determined based on the polarity difference between two of the signals 802, 804 and 806. The decoder having determined direction of rotation can determine the current phase state and the polarity of the voltage applied between the two active connectors 710a, 710b and/or 710c, or the direction of current flow through the two active conductors 710a, 710b and/or 710c.

In the example of the three-wire, three-phase link described herein, one bit of data may be encoded in the rotation, or phase change in the three-wire, three-phase link, and an additional bit may be encoded in the polarity of two driven wires. Certain embodiments, encode more than two bits in each transition of a three-wire, three-phase encoding system by allowing transition to any of the possible states from a current state. Given three rotational phases and two polarities for each phase, 6 states are defined, such that 5 states are available from any current state. Accordingly, there may be $\log_2(5) \cong 2.32$ bits per symbol (transition) and the mapper may accept a 16-bit word and convert it to 7 symbols.

Figure 9:
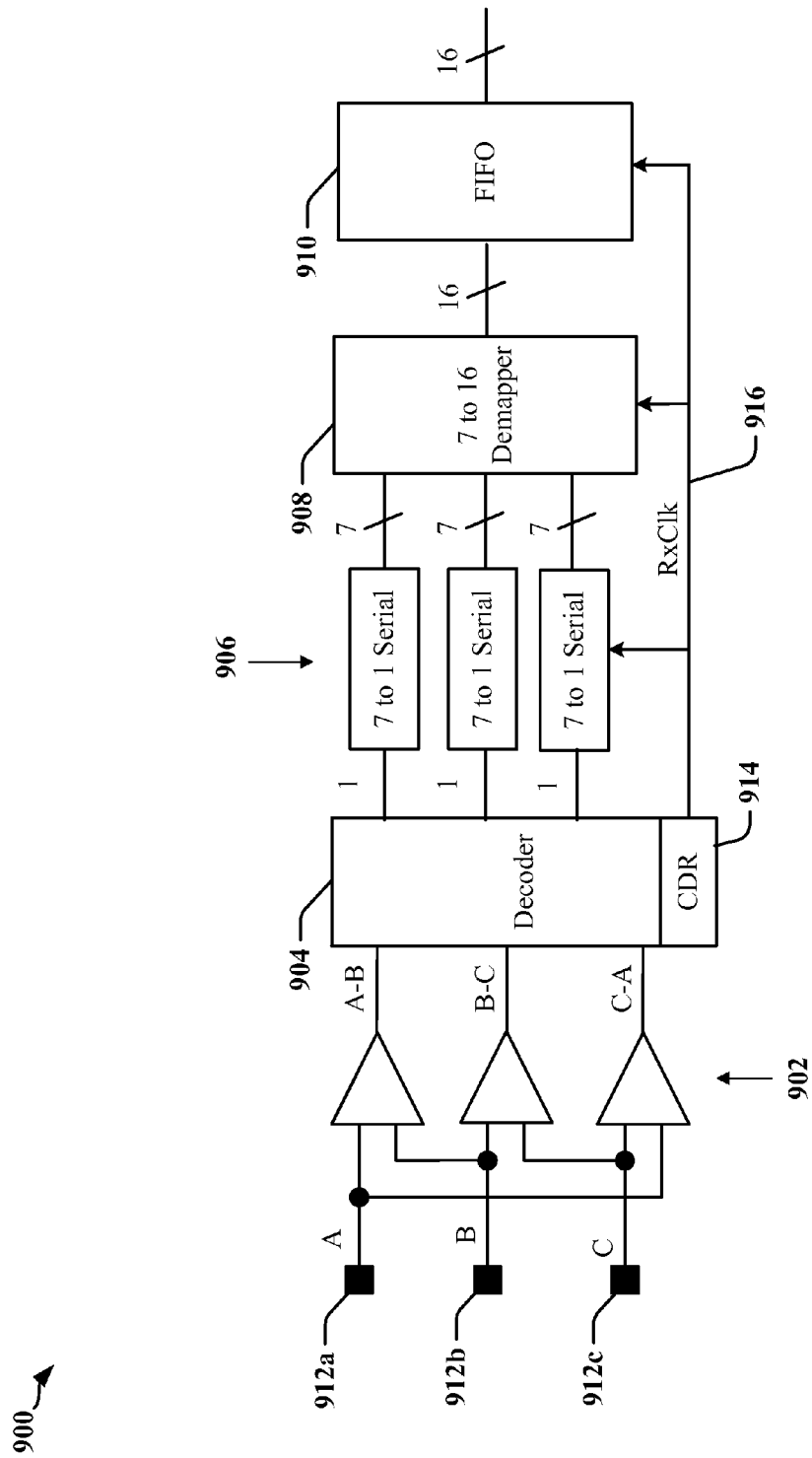
FIG. 9 illustrates an example of a three-wire, three-phase polarity data decoder.

FIG. 9 is a block schematic drawing 900 illustrating an example of a receiver in a three-phase interface. Comparators 902 and decoder 904 are configured to provide a digital representation of the state of each of three transmission lines 912a, 912b and 912c, as well as the change in the state of the three transmission lines compared to the state transmitted in the previous symbol period. As can be seen from the illustrated example, the voltage of each connector 912a, 912b or 912c may be compared to the voltages of the other two connectors 912a, 912b and/or 912c to determine the state of each connector 912a, 912b or 912c, such that the occurrence of a transition may be detected and decoded by the decoder 904 based on the outputs of the comparators 902. Seven consecutive states are assembled by serial to parallel convertors 906, which produce sets of 7 symbols to be processed by demapper 908 to obtain 16 bits of data that may be buffered in the FIFO 910. The decoder 904 may include a CDR circuit 914 configured to extract a receive clock 916 from transitions in signaling states between consecutive pairs of transmitted symbols.

TABLE 1

| State | Wire amplitude | | | Diff. Rx output | | | Receiver Digital Output | | |
|---|---|---|---|---|---|---|---|---|---|
| | A | B | C | A-B | B-C | C-A | Rx_AB | Rx_BC | Rx_CA |
| +x | +V | 0 | +V/2 | +V | −V/2 | −V/2 | 1 | 0 | 0 |
| −x | 0 | +V | +V/2 | −V | +V/2 | +V/2 | 0 | 1 | 1 |
| +y | +V/2 | +V | 0 | −V/2 | +V | −V/2 | 0 | 1 | 0 |
| −y | +V/2 | 0 | +V | +V/2 | −V | +V/2 | 1 | 0 | 1 |
| +z | 0 | +V/2 | +V | −V/2 | −V/2 | +V | 0 | 0 | 1 |
| −z | +V | +V/2 | 0 | +V/2 | +V/2 | −V | 1 | 1 | 0 |

Table 1 illustrates the operation of the differential receivers 902. In the example, the wire states 822 may be encoded in the voltage amplitude on the three wires 912a, 912b and 912c such that the +1 state of a wire is represented as a voltage +V volts, the −1 state of the wire is represented as 0 volts and the undriven state is represented or approximated as +V/2 volts. In particular, Table 1 illustrates the outputs of the differential receivers 902 for each wire state 822 in the three-wire three-phase Polarity encoding system. A receiver/decoder may be configured to output a code at the digital output of the receiver for each symbol decoded.

Certain N-wire interfaces may be adapted to provide increased bandwidth through the use of DDR clocking, whereby a new symbol is transmitted at both the rising and falling edges of a transmit clock. However, conventional CDR circuits may be unable to respond to DDR clocking and/or conventional CDR circuits may limit the maximum possible operation speed of an N! wire or N-phase interface.

CCIe Interface

Figure 10:
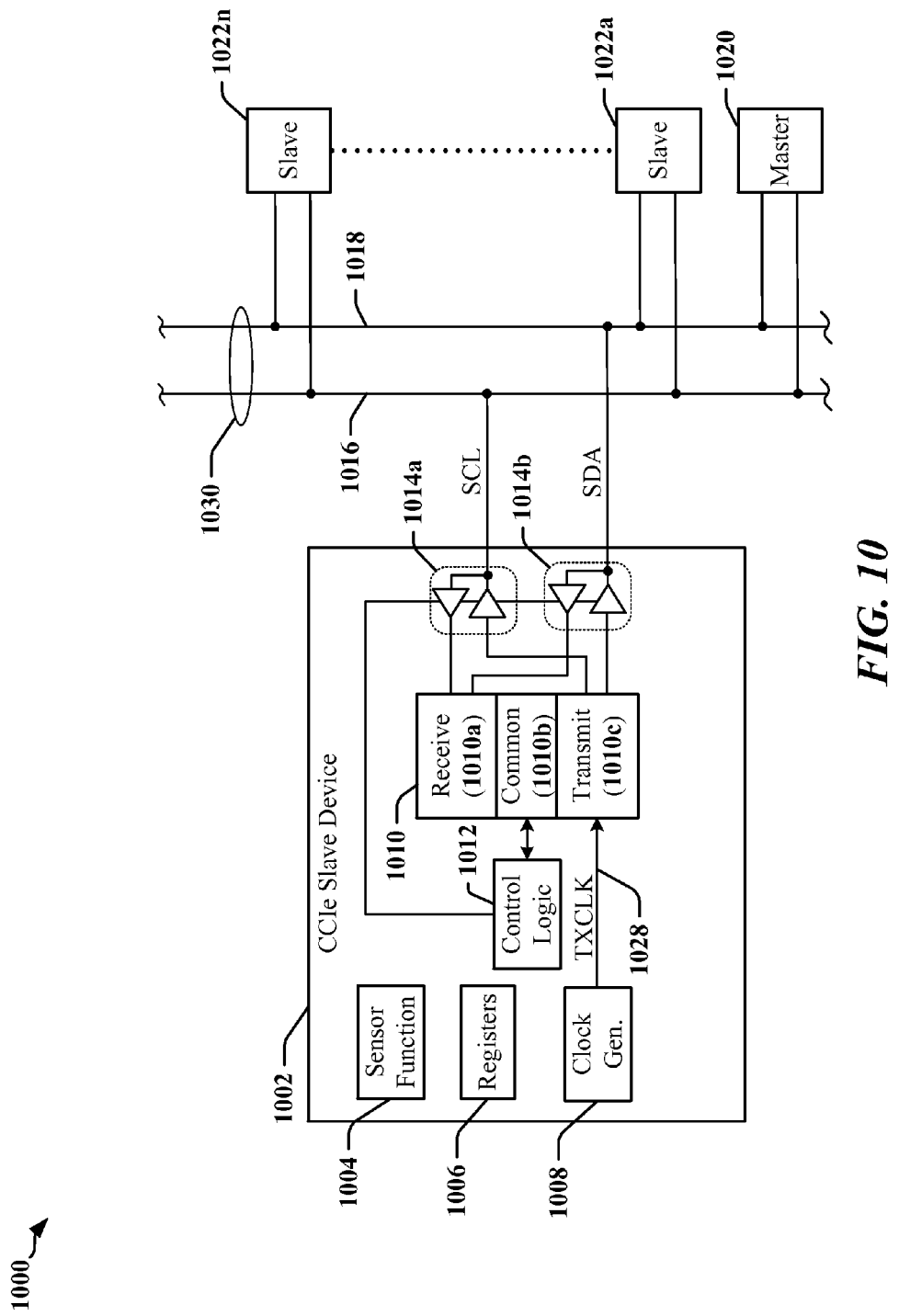
FIG. 10 illustrates a system architecture for an apparatus employing a data link between IC devices.

FIG. 10 is a block schematic illustrating certain aspects of an apparatus 1000 connected to a communications bus, where the apparatus may be embodied in one or more of a wireless mobile device, a mobile telephone, a mobile computing system, a wireless telephone, a notebook computer, a tablet computing device, a media player, a gaming device, or the like. The apparatus 1000 may include multiple devices 1002, 1010 and 1022a-222n, which communicate using a CCIe bus 1030. The CCIe bus 1030 can extend the capabilities of a conventional CCI bus for devices that are configured for enhanced features supported by the CCIe bus 1030. For example, the CCIe bus 1030 may support a higher bit rate than a CCI bus. According to certain aspects disclosed herein, some versions of the CCIe bus may be configured or adapted to support bit rates of 16.7 Mbps or more, and some versions of the CCIe bus may be configured or adapted to support data rates of at least 23 megabits per second.

In the example illustrated in FIG. 10, an imaging device 1002 is configured to operate as a slave device on the CCIe bus 1030. The imaging device 1002 may be adapted to provide a sensor control function 1004 that manages an image sensor, for example. In addition, the imaging device 1002 may include configuration registers or other storage 1006, control logic 1012, a transceiver 1010 and line drivers/receivers 1014a and 1014b. The control logic 1012 may include a processing circuit such as a state machine, sequencer, signal processor or general-purpose processor. The transceiver 1010 may include a receiver 1010a, a transmitter 1010c and common circuits 1010b, including timing, logic and storage circuits and/or devices. In one example, the transmitter 1010c encodes and transmits data based on timing provided by a clock generation circuit 1008.

Figure 11:
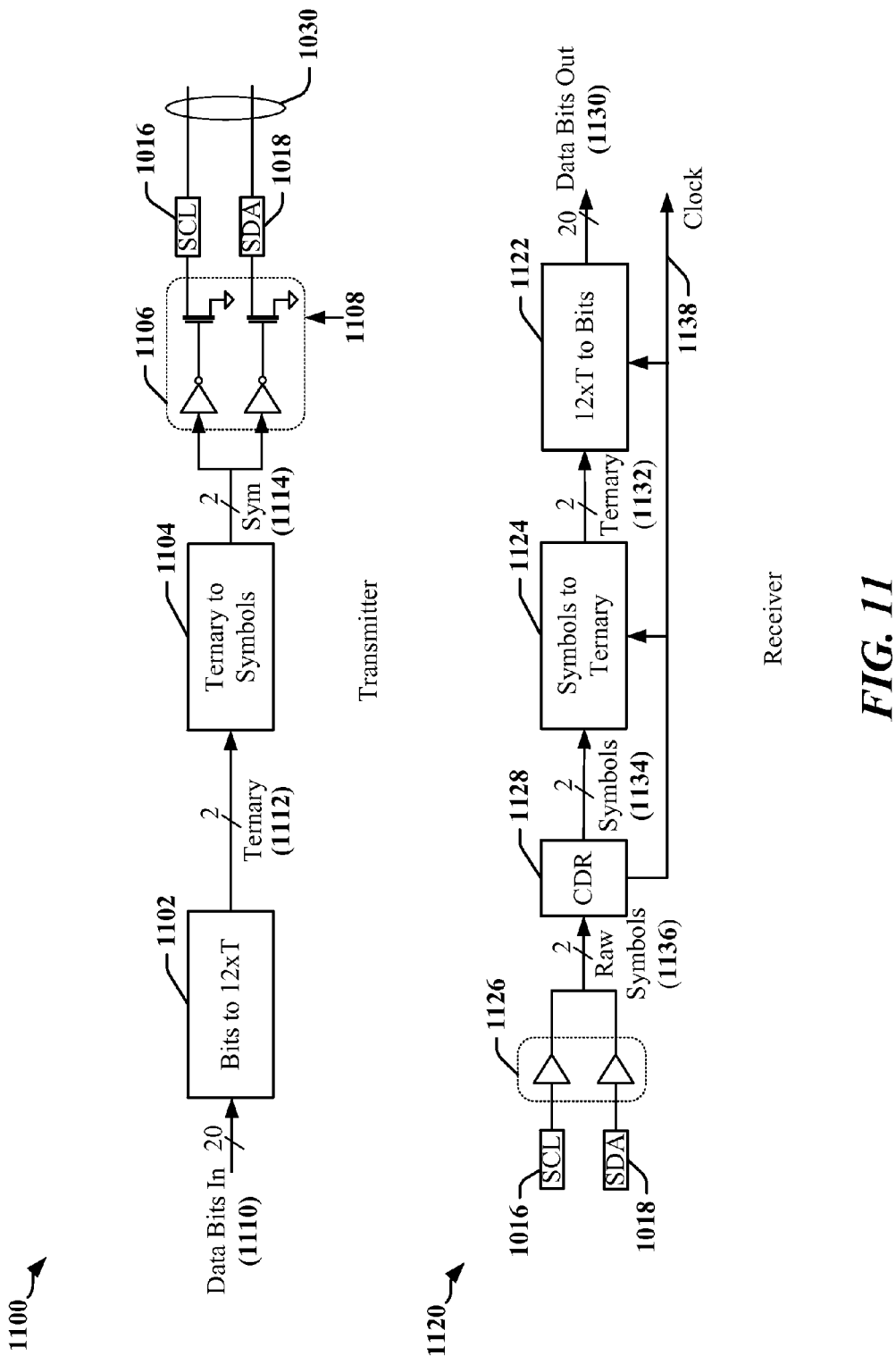
FIG. 11 illustrates certain aspects of a transmitter and a receiver according to certain aspects disclosed herein.

FIG. 11 is a block diagram illustrating an example of a transmitter 1100 and a receiver 1120 configured according to certain aspects disclosed herein. For CCIe operations, the transmitter 1100 may transcode data 1110 into ternary (base-3) numbers which are encoded as symbols transmitted on the SCL 1016 and SDA 1018 signal wires. In the example depicted, each data element (also referred to as a data word) of the input data 1110 may have 19 or 20 bits. A transcoder 1102 may receive the input data 1110 and produce a sequence of ternary numbers 1112 for each data element. The ternary numbers 1112 may be encoded in two bits and there may be 12 ternary numbers 1112 in each ternary sequence. An encoder 1104 produces a stream of 2-bit symbols 1114 that are transmitted through line drivers 1106. In the example depicted, the line drivers 1106 include open-drain output transistors 1108. However, in other examples, the line drivers 1106 may drive the SCL 1016 and SDA 1018 signal wires using push-pull drivers. The output stream of 2-bit symbols 1114 generated by the encoder has a transition in the state of at least one of the SCL 1016 and SDA 1018 signal wires between consecutive symbols 1114 by ensuring that no pair of consecutive symbols includes two identical symbols. The availability of a transition of state in at least one wire 1016 and/or 1018 permits a receiving circuit 1120 to extract a receive clock 1138 from the stream of data symbols 1114.

In a CCIe system, the receiver 1120 may include or cooperate with a clock and data recovery circuit (CDR) 1128. The receiver 1120 may include line interface circuits 1126 that provide a stream of raw 2-bit symbols 1136 to the CDR 1128. The CDR 1128 extracts a receive clock 1138 from the raw symbols 1136 and provides a stream of 2-bit symbols 1134 and the receive clock 1138 to other circuits 1124 and 1122 of the receiver 1120. In some examples, the CDR 1128 may produce multiple clocks 1138. A decoder 1124 may use the receive clock 1138 to decode the stream of symbols 1134 into sequences of 12 ternary numbers 1132. The ternary numbers 1132 may be encoded using two bits. A transcoder 1122 may then convert each sequence of 12 ternary numbers 1132 into 19-bit or 20-bit output data elements 1130.

Figure 12:
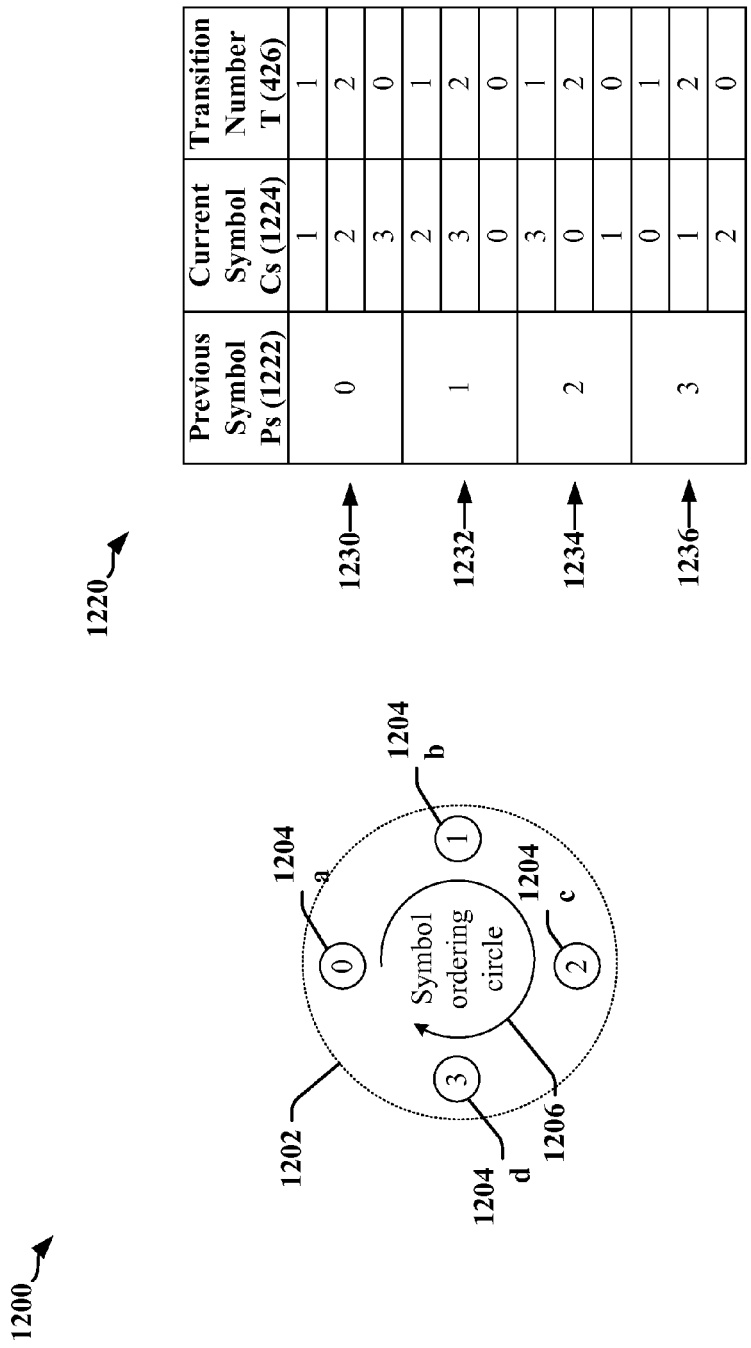
FIG. 12 illustrates an encoding scheme for transcoding data according to certain aspects disclosed herein.

FIG. 12 is a drawing illustrating an encoding scheme 1200 that may be used by the encoder 1104 to produce a sequence of symbols 1114 with an embedded clock for transmission on the CCIe bus 1030. The encoding scheme 1200 may also be used by a decoder 1124 to extract ternary transition numbers from symbols received from the CCIe bus 1030. In the CCIe encoding scheme 1200, the two wires of the CCIe bus 1030 permit definition of 4 basic symbols S: {0, 1, 2, 3}. Any two consecutive symbols in the sequence of symbols 1114, 1134 have different states, and the symbol sequences 0,0, 1,1, 2,2 and 3,3 are invalid combinations of consecutive symbols. Accordingly, only 3 valid symbol transitions are available at each symbol boundary, where the symbol boundary is determined by the transmit clock and represents the point at which a first symbol (previous symbol Ps) 1222 terminates and a second symbol (current symbol Cs) 1224 begins.

According to certain aspects disclosed herein, the three available transitions are assigned a transition number (T) 1226 for each Ps symbol 1222. The value of T 1226 can be represented by a ternary number. In one example, the value of transition number 1226 is determined by assigning a symbol ordering circle 1202 for the encoding scheme. The symbol ordering circle 1202 allocates locations 1204a-1204d on the circle 1202 for the four possible symbols, and a direction of rotation 1206 between the locations 1204a-1204d. In the depicted example, the direction of rotation 1206 is clockwise. The transition number 1226 may represent the separation between the valid current symbols 1224 and the immediately preceding symbol 1222. Separation may be defined as the number of steps along the direction of rotation 1206 on the symbol ordering circle 1202 required to reach the current symbol Cs 1224 from the previous symbol 1222. The number of steps can be expressed as a single digit base-3 number. It will be appreciated that a three-step difference between symbols can be represented as a $0_{base-3}$. The table 1220 in FIG. 12 summarizes an encoding scheme employing this approach.

At the transmitter 1100, the table 1220 may be used to lookup a current symbol 1224 to be transmitted, given knowledge of the previously generated symbol 1222 and an input ternary number, which is used as a transition number 1226. At the receiver 1120, the table 1220 may be used as a lookup to determine a transition number 1226 that represents the transition between the previously received symbol 1222 and the currently received symbol 1224. The transition number 1226 may be output as a ternary number.

Figure 13:
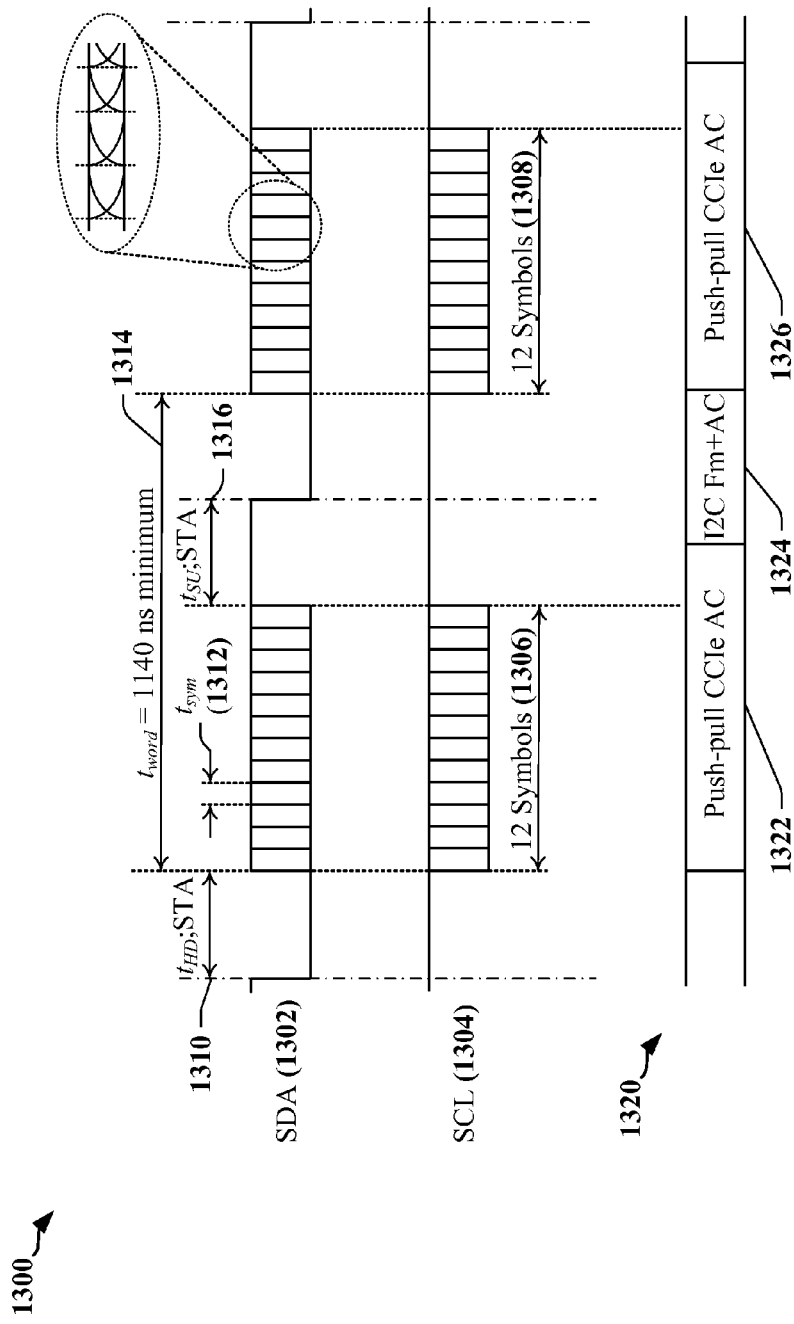
FIG. 13 is a timing chart illustrating an example of data transmissions on a CCIe bus configured to support I2C devices.

FIG. 13 is a timing diagram 1300 that illustrates data transmission on a CCIe bus 1030 when the devices 1002, 1020, 1022a-n connected to the bus 1030 include an I2C device. In the example, the CCIe devices use push-pull drivers to drive the signal wires 1302, 1304, rather than open-drain drivers used by the I2C device. An effective data rate of approximately 14 megabits per second (Mbps) may be achieved for the CCIe transmission when the symbol rate is 20 MHz. As described herein, 19 bits of data may be converted to sequences of 12 symbols 1306, 1308, which control the state of the SDA signal 1302 and the SCL signal 1304 for each symbol period ($t_{sym}$) 1312 in the sequence of symbols 1306 or 1308. As depicted, each symbol period 1312 may be 130 ns in duration. The 19 bits may include 16 bits of data, with 3 bits of overhead.

The timing between consecutive sequences of symbols 1306 and 1308 may be dominated by time periods required to satisfy the protocols governing the operation of I2C devices. In one example, a start condition 1310 precedes each transmission 1306, 1308 and has a duration ($t_{HD}$) of at least 260 ns. The start condition 1310 may be defined by a symbol value of "1" such that the SDA signal 1302 is held low while the SCL signal 1304 remains high. The start condition 1310 may follow a minimum setup period ($t_{SU}$) 1316 when both signals 1302 and 1304 are in a high state, as defined by a symbol value of "3." The minimum setup period ($t_{SU}$) 1316 may commence after a transmission 1306 or 1308 terminates, and the minimum setup period ($t_{SU}$) 1316 may be maintained for at least 260 ns. Accordingly, the minimum elapsed time 1314 between the start of a first transmission 1306 and the start of a second transmission 1308 may be calculated as:

$$t_{word} = t_{HD} + t_{SU} + 12 \times t_{sym} = (260 + 260 + 12 \times (50)) \text{ns} = 1120 \text{ ns.}$$

An additional, nominal 20 ns may be included for signal fall time (tf) between setup and start time. The signal fall time may be calculated as:

$$t_f = \left(20 \times \frac{VDD}{5.5}\right) \text{ ns (min)}$$

Accordingly, 19 bits of data may be transmitted in a minimum of 1140 ns, with a corresponding raw bit rate of approximately 16.7 Mbps and a useful bit rate of approximately 14.04 Mbps, since 16 bits are transmitted in the 12 symbols.

The minimum required time between the transmissions 1306 and 1308 is significantly greater when I2C devices are accommodated on the bus 1030 than when only CCIe devices are involved in the communication. FIG. 13 includes a timing diagram 1320 that illustrates the increased time 1324 of adding I2C setup and start periods in order to provide backwards compatibility for I2C devices.

Figure 14:
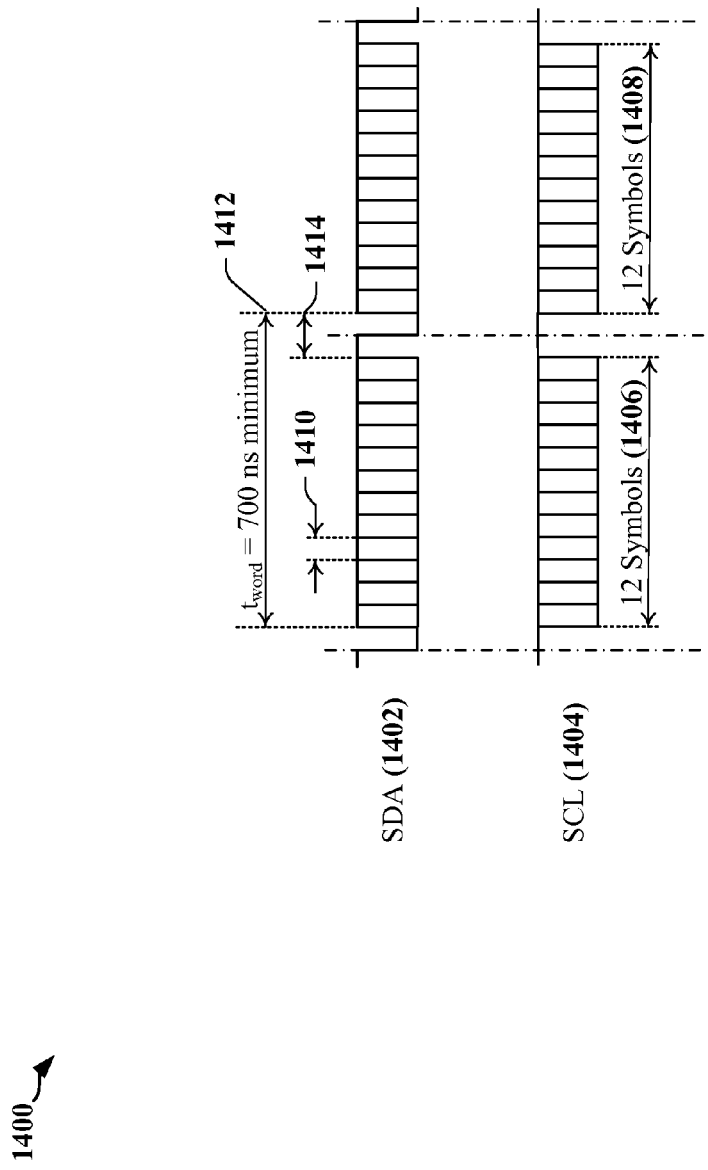
FIG. 14 is a timing chart illustrating an example of data transmissions on a CCIe bus when no I2C devices are connected or monitoring the CCIe bus.

FIG. 14 is a timing diagram 1400 that illustrates data transmission on a CCIe bus 1030 when the devices 1002, 1020, 1022a-n on the bus 1030 do not include an active I2C device. In this example, push-pull drivers are used to drive the signal wires 1402, 1404. A link rate of 22.86 Mbps may be achieved with a 20 MHz symbol rate. Sequences of 12 symbols 1406, 1408 encode 16 bits of data and 3 bits of overhead. Each symbol in the sequence of 12 symbols 1406, 1408 defines the state of the SDA signal 1402 and the SCL signal 1404 for each symbol period ($t_{sym}$) 1410. Each symbol period 1410 may be 50 ns in duration for a 20 MHz symbol clock. The two symbol sequence {3,1} is transmitted in the period 1414 between consecutive sequences of symbols 1406 and 1408. The minimum elapsed time 1412 between the start of a first transmission 1406 and the start of a second transmission 1408 may be calculated as:

$$t_{word} = 14 \times t_{sym} = 700 \text{ ns}$$

When CCIe devices with push-pull drivers are used, 19 bits of data may be transmitted in 700 ns, providing a raw bit rate of approximately 27.1 Mbps with a useful bit rate of approximately 22.86 Mbps, since 16 data bits are transmitted in each 12 symbol word 1406, 1408.

Clock and Data Recovery

Figure 15:
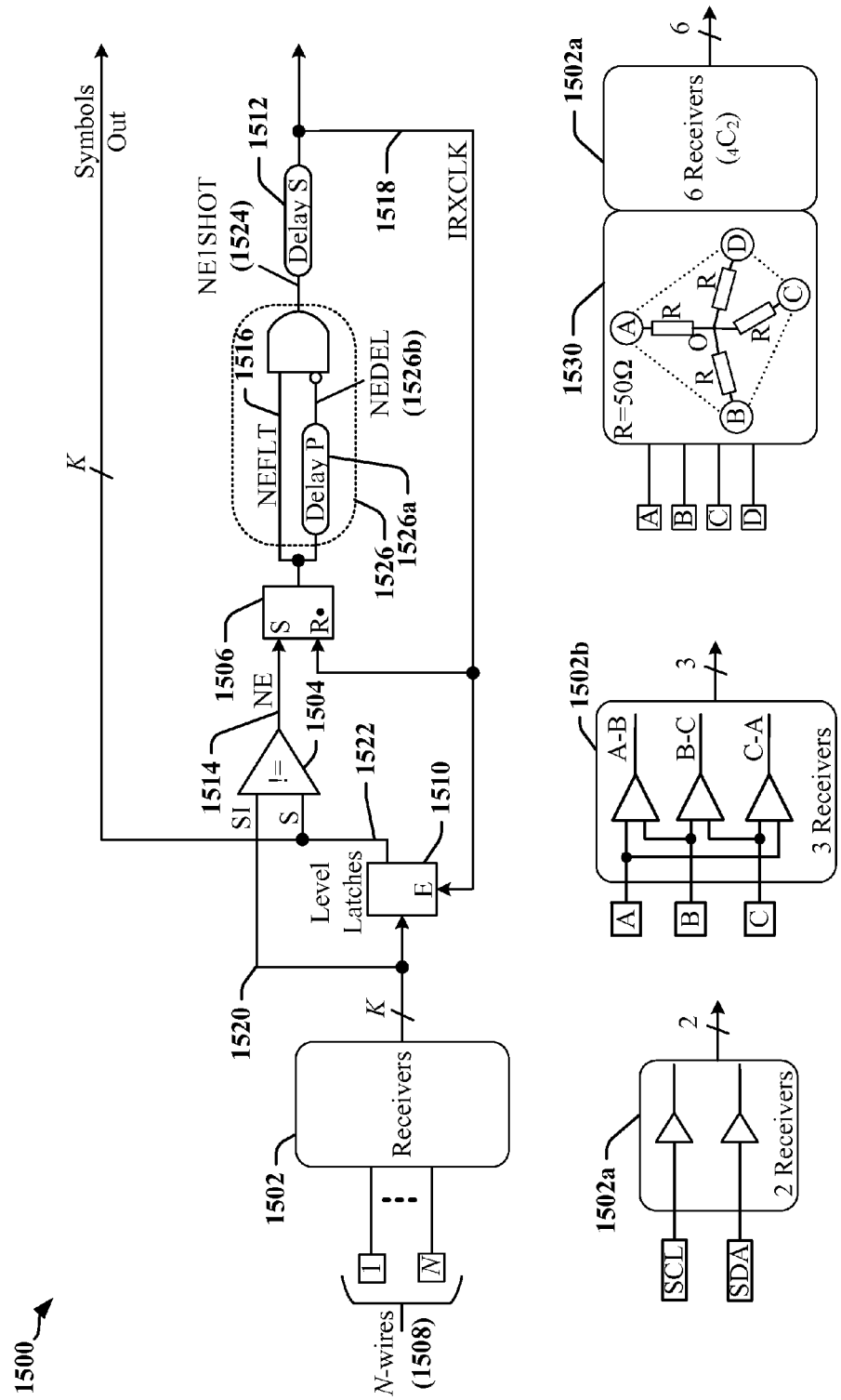
FIG. 15 illustrates a clock and data recovery circuit that may be used in an N-wire communication interface in accordance with one or more aspects disclosed herein.
Figure 16:
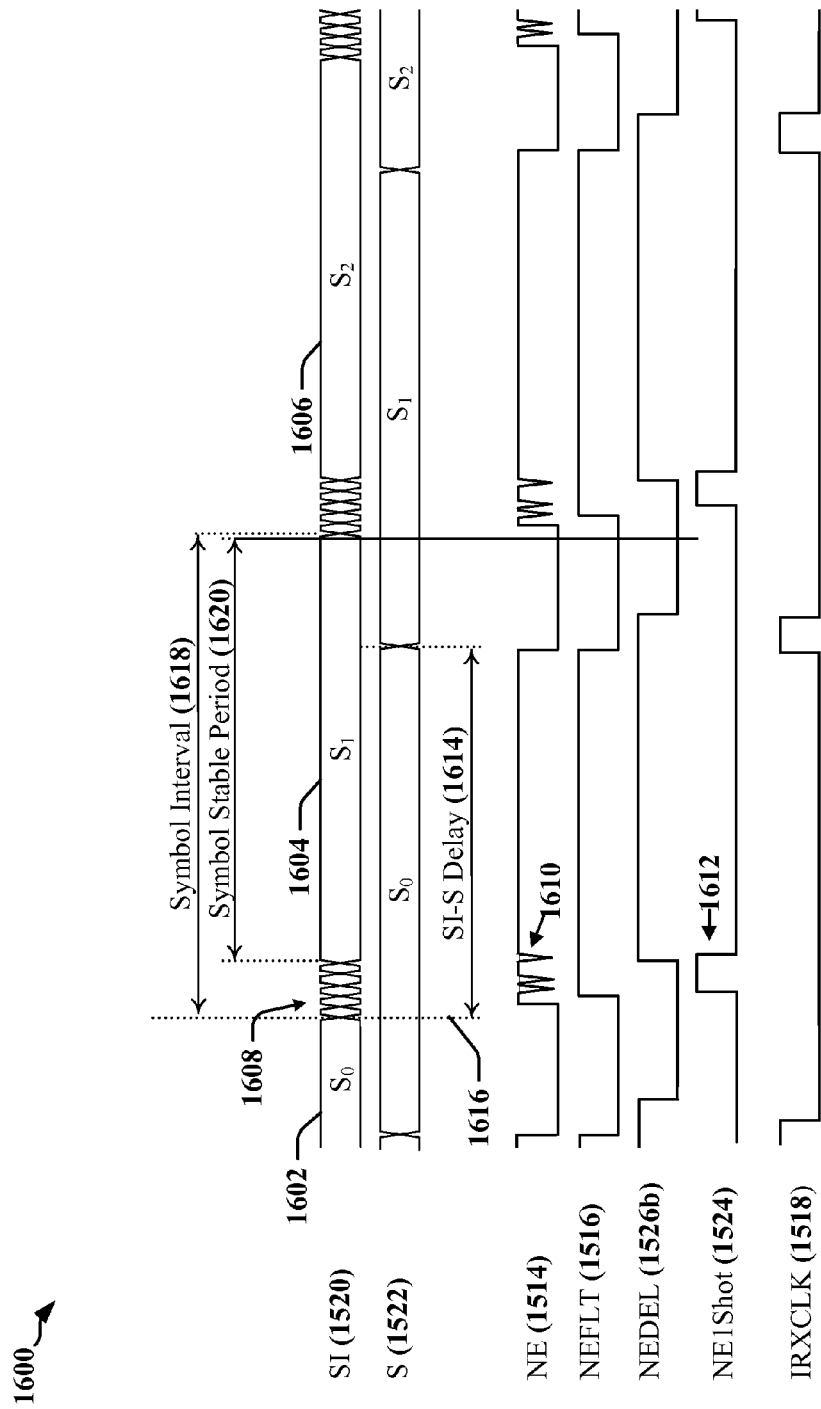
FIG. 16 illustrates timing of certain signals associated with the clock and data recovery circuit of FIG. 15, in accordance with one or more aspects disclosed herein.

FIG. 15 illustrates an example of a clock and data recovery (CDR) circuit 1500 that may be employed to recover embedded clock information in an N-wire system. FIG. 16 is a timing diagram 1600 illustrating certain signals generated through the operation of the CDR circuit 1500. The CDR circuit 1500 and its timing diagram 1600 are provided by way of generalized example, although other variants of the CDR circuit 1500 and/or other CDR circuits may be used in some instances. Signals received from N-wires 1508 are initially processed by a number of receivers 1502, which produce a corresponding number of raw signals as outputs. In one example, N=4 wires 1508 are processed by $_4C_2$=6 receivers 1502 that produce a first state transition signal (SI signal) 1520 that includes 6 raw signals representative of the received symbol. In another example, symbols transmitted over N=2 wires 1508 of a CCIe interface may be received by two receivers 1502. For each raw signal output from each different receiver there may be a period of time 1608 between symbols $S_0$ 1602 and $S_1$ 1604 during which the state of the corresponding signal is undefined, indeterminate, transient or otherwise unstable. Level latches 1510, a comparator 1504, set-reset latch 1506, a one-shot circuit 1526, an analog delay element 1512 and (bused) level latches 1510 may be configured to generate a level-latched signal (S signal) 1522 representative of a delayed instance of the SI signal 1520, where the delay before the SI signal 1520 is captured by the level latches 1510 to provide an updated S signal 1522 may be selected by configuring a delay element (Delay S) 1512.

In operation, the comparator 1504 compares the SI signal 1520 with the S signal 1522 and outputs a binary comparison signal (NE signal) 1514. The set-reset latch 1506 may receive the NE signal 1514 from the comparator 1504 and output a signal (NEFLT signal) 1516, which is a filtered version of the NE signal 1514. The operation of the set-reset latch 1506 can be configured to remove any transient instability in the NE signal 1514, where the transient instability is exhibited as spikes 1610 in the NE signal 1514. The "Reset" input of the set-reset latch 1506 may be prioritized such that the NEFLT signal 1516 is reset when the IRXCLK signal 1518 is high, regardless of the state of the NE signal 1514.

The one-shot circuit 1526 receives the NEFLT signal 1516 and produces a fixed width pulse 1612, which may then be delayed by the delay element 1512 to produce an internal receive clock (IRXCLK) signal 1518. In some instances, the IRXCLK signal 1518 may be used by external circuitry to sample the data output 1528 of the CDR 1500. In one example, the IRXCLK signal 1518, or a derivative signal of the IRXCLK signal 1518 may be provided to decoder or deserializer circuits. In some instances, other signals 1516, 1524 may be used to generate a clock signal for external circuitry. The level latches 1510 receive the SI signal 1520 and output the S signal 1522, where the level latches 1510 are triggered or otherwise controlled by the IRXCLK signal 1518. In one example, the output 1522 of the level latches 1510 may serve as the symbols output of the CDR circuit 1500. In other examples, additional circuitry may be included in the CDR circuit 1500 to delay, latch and/or otherwise condition the output 1522 of the level latches 1510 for use as the symbols output of the CDR circuit 1500.

In operation, the comparator 1504 compares the SI signal 1520 with the S signal 1522, which is output from the level latches 1510. The comparator 1504 drives the NE signal 1514 to a first state (e.g. logic low) when the SI signal 1520 and the S signal 1522 are equal, and to a second state (e.g. logic high) when the SI signal 1520 and the S signal 1522 are not equal. The NE signal 1514 is in the second state when the SI signal 1520 and the S signal 1522 are representative of different symbols. Thus, the second state indicates that a transition is occurring.

As can be appreciated from the timing diagram 1600, the S signal 1522 is essentially a delayed and filtered version of SI signal 1520, in which transients or glitches 1608 have been removed because of the delay 1614 between the SI signal 1520 and the S signal 1522. Multiple transitions 1608 in the SI signal 1520 may be reflected as spikes 1610 in the NE signal 1514, but these spikes 1610 are masked from the NEFLT signal 1516 through the operation of the set-reset circuit. Moreover, the IRXCLK SIGNAL 1518 is resistant to line skew and glitches in the symbol transitions based on the use of the delays 1526a, 1512 provided in the feedback path to the level-latch 1510 and set-reset circuit 1506, whereby the IRXCLK signal 1518 controls the reset function of the set-reset circuit 1506.

At the commencement 1616 of a transition between a first symbol value $S_0$ 1602 and a next symbol value $S_1$ 1604, the SI signal 1520 begins to change state. The state of the SI signal 1520 may be different from St 1604 due to the possibility that intermediate or indeterminate states 1608 during the transition between $S_0$ 1602 and $S_1$ 1604. These intermediate or indeterminate states 1608 may be caused, for example, by inter-wire skew, over/under shoot, cross-talk, etc.

The NE signal 1514 becomes high as soon as the comparator 1504 detects a difference in values between the SI signal 1520 and the S signal 1522, and the transition high of the NE signal 1514 asynchronously sets the set-reset latch 1506 output, driving the NEFLT signal 1516 high. The NEFLT signal 1516 is maintained in its high state until the set-reset latch 1506 is reset by a high state of the IRXCLK signal 1518. The IRXCLK signal 1518 is a delayed version of the NE1SHOT signal 1524, which is a limited pulse-width version of the NEFLT signal 1516. The IRXCLK signal 1518 may be delayed with respect to the NE1SHOT signal 1524 through the use of the analog delay circuit 1512, for example.

The intermediate or indeterminate states 1608 on SI 1520 may represent invalid data. These intermediate or indeterminate states 1608 may contain a short period of the previous symbol value $S_0$ 1602, and may cause the NE signal 1514 to return low for short periods of time. Transitions of the SI signal 1520 may generate spikes 1610 on the NE signal 1514. The spikes 1610 are effectively filtered out and do not appear in the NEFLT signal 1516.

The high state of the NEFLT signal 1516 causes the IRXCLK signal 1518 to transition high after a delay period 1540 caused by the delay circuit 1512. The high state of IRXCLK signal 1518 resets the set-reset latch 1506 output, causing the NEFLT signal 1516 to transition to a low state. The high state of the IRXCLK signal 1518 also enables the level latches 1510, and the SI signal 1520 value may be output on the S signal 1510.

The comparator 1504 detects that the S signal 1522 (for symbol $S_1$ 1602) matches the symbol $S_1$ 1602 value present on the SI signal 1520 and switches its output (the NE signal 1514) low. The low state of the NEFLT signal 1516 causes the IRXCLK signal 1518 to go low after a delay period 1542 caused by the analog delay 1512. This cycle repeats for each transition in the SI signal 1520. At a time after the falling edge of the IRXCLK signal 1518, a new symbol $S_2$ 1606 may be received and may cause the SI signal 1520 to switch its value in accordance with the next symbol $S_2$ 1606.

FIG. 15 provides one example of a CDR circuit 1500. Certain interfaces may benefit from the use of other examples of a CDR circuit that may be adapted or configured to delay or advance a sampling edge with respect to a period of time 1620 during which a received symbol 1604 is stable and can be reliably captured. The CDR circuit 1500 illustrated may be adapted or configured for use in various communications interfaces. For example, the type and/or configuration of the receivers 1502 may be determined based on the signal encoding techniques employed in an interface. In a first example, a two receiver configuration 1502a may be employed to receive signals from a two-wire CCIe serial bus. In a second example, a three receiver configuration 1502b may be employed to compare pairs of signals received from a three-wire 3-phase encoded interface. In a third example, a six receiver configuration 1502b may be employed compare signals received from different combinations of two signals received on a four-wire N! (4!) encoded interface.

Filtering Glitches Occurring when Symbol is Expected to be Stable

Certain aspects disclosed herein relate to a CDR circuit that is adapted to prevent extra receive clock pulses when symbol glitches occur during periods of time when the state of the signal wires are expected to be stable. Glitches may change the signaling state of the signal wires as detected by a receiver. Glitches may occur due to transients related to electromagnetic interference, electrostatic discharges, power rail noise and/or through the effect of noise on transmitting and/or receiving circuits.

Figure 17:
FIG. 17 illustrates the generation of an additional clock pulse when glitches occur during a received symbol stable period of time.

FIG. 17 illustrates the effect of glitches 1708 during expected stable periods 1720 on the CDR circuit 1500 illustrated in FIG. 15. As discussed in relation to FIG. 6, the CDR circuit 1500 may be configured to recover embedded clock information in an N-wire system from a number of raw signals representative of the signaling state of the N-wires 1508. For each raw signal output from each different receiver there may be a setup time 1606 provided between symbols $S_0$ 1702 and $S_1$ 1704 during which the state of the corresponding signal is undefined, indeterminate, transient or otherwise unstable. As described in relation to FIG. 15, level latches 1510, a comparator 1504, set-reset latch 1506, a one-shot circuit 1526, an analog delay element 1512 and (bused) level latches 1510 may be configured to generate a pulse 1714 in the clock (IRXCLK) signal 1518 and to capture a level-latched signal (S signal) 1522 representative of a delayed instance of the SI signal 1520. The delay before the SI signal 1520 is captured by the level latches 1510 to provide an updated S signal 1522 may be selected by configuring a delay element (Delay S) 1512.

The glitches 1708 in FIG. 17 occur at a point in time when $S_1$ 1704 is expected to be stable, and after the level latches 1510 have captured $S_1$ 1704 from the SI signal 1520. The glitches 1708 occur when the output NE 1514 of the comparator 1504 is low, indicating no difference between the captured S signal 1522 and the current signaling state (SI 1520) of the signal wires 1508. The NE signal 1514 transitions to a high level when it detects a difference between the S signal 1522 and the SI signal 1520 caused by the glitches 1708, which may affect the signal wires 1508 or receivers 1502, for example. The set-reset latch 1506 receives the NE signal 1514 from the comparator 1504 and causes the NEFLT signal 1516 to transition high, which results in the generation of an extra pulse 1716 in the IRXCK signal 1518, as described in relation to the generation of clock pulses 1714 in relation to FIG. 15.

Figure 18:
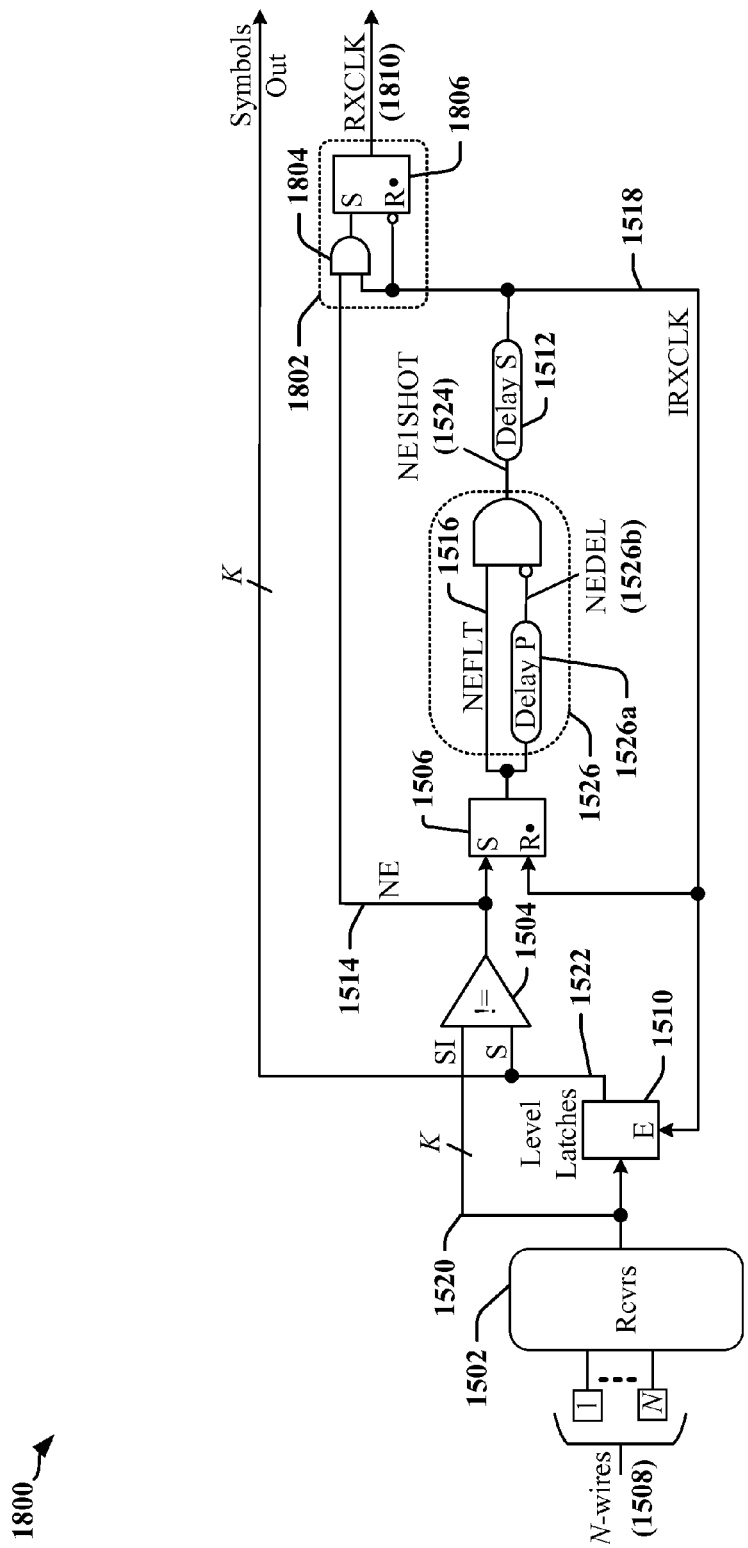
FIG. 18 illustrates a clock and data recovery circuit that includes circuitry that filters additional clock pulses caused by certain glitches in received symbols.
Figure 19:
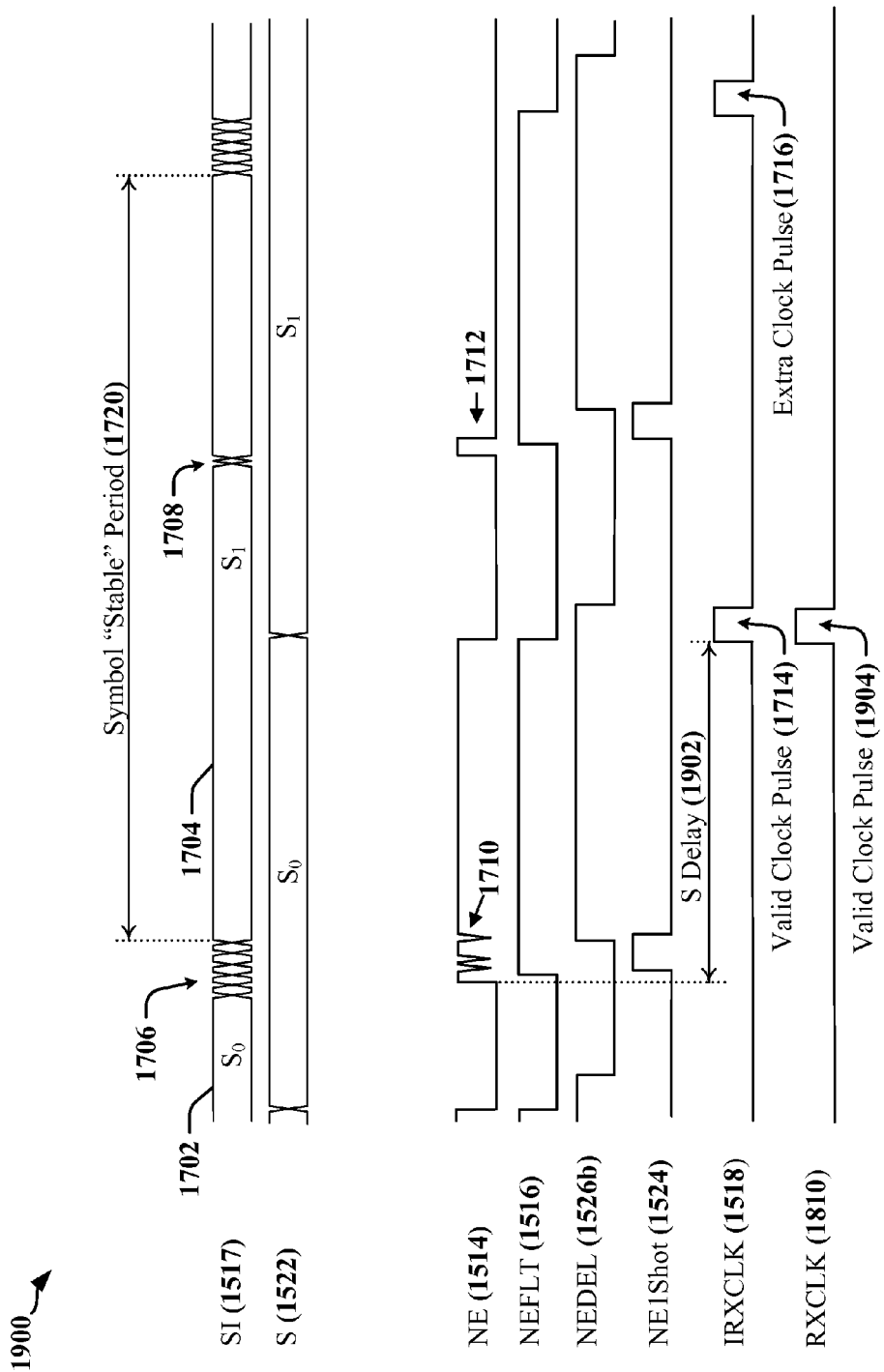
FIG. 19 illustrates timing of certain signals generated in the clock and data recovery circuit of FIG. 18, in accordance with one or more aspects disclosed herein.

FIG. 18 illustrates an example of a CDR circuit 1800 that provides an output receive clock (RXCLK) signal 1810 that can exclude invalid pulses attributable to glitches 1708 that occur during expected stable periods 1720. FIG. 19 illustrates certain aspects of signal timing in the CDR circuit 1800. The CDR circuit 1800 is based on the CDR circuit 1500 of FIG. 15, and includes an output circuit 1802 that serves to block additional, invalid clock pulses 1716 on the IXRCLK signal 1518 from appearing on the RXCLK signal 1810. The output circuit 1802 includes a set-reset latch 1806 that is set when the output of an AND gate 1804 is high. The "Reset" input of the set-reset latch 1806 may be prioritized such that the RXCLK signal 1810 is reset when the IRXCLK signal 1518 is low, regardless of the state of the NE signal 1514. The output of the AND gate 1804 is high when both the NE signal 1514 is at logic high and the IRXCLK signal 1518 is at logic high levels. The NE signal 1514 is at logic high when a difference exists between the SI signal 1520 (indicating signaling state of the wires 1508) and the S signal 1522, which is the latched version of the last received symbol. The IRXCLK signal 1518 follows the NE signal 1514 transition high after a delay period 1902 provided by the delay element (Delay S) 1512. The set-reset latch 1806 of the output circuit 1802 is set only when the NE signal 1514 remains at logic high for at least the duration of the delay period 1902. The output circuit 1802 produces a pulse 1904 after a valid symbol transition because the NE signal 1514 remains at a high level until the level latches 1510 are clocked by a valid clock pulse 1714 on the IRXCLK signal 1518. Typically, the NE signal 1514 returns to logic zero after short-lived glitches 1708 and before an extra pulse 1716 is generated in the IRXCLK signal 1518. Consequently, the output circuit 1802 can filter extra pulses 1716 in the IRXCLK signal 1518 caused by glitches 1708 that occur during expected stable periods 1720. The output circuit 1802 is reset when the IRXCK signal 1518 is at the logic low level.

Glitches Coincident with Sampling Edges

Figure 20:
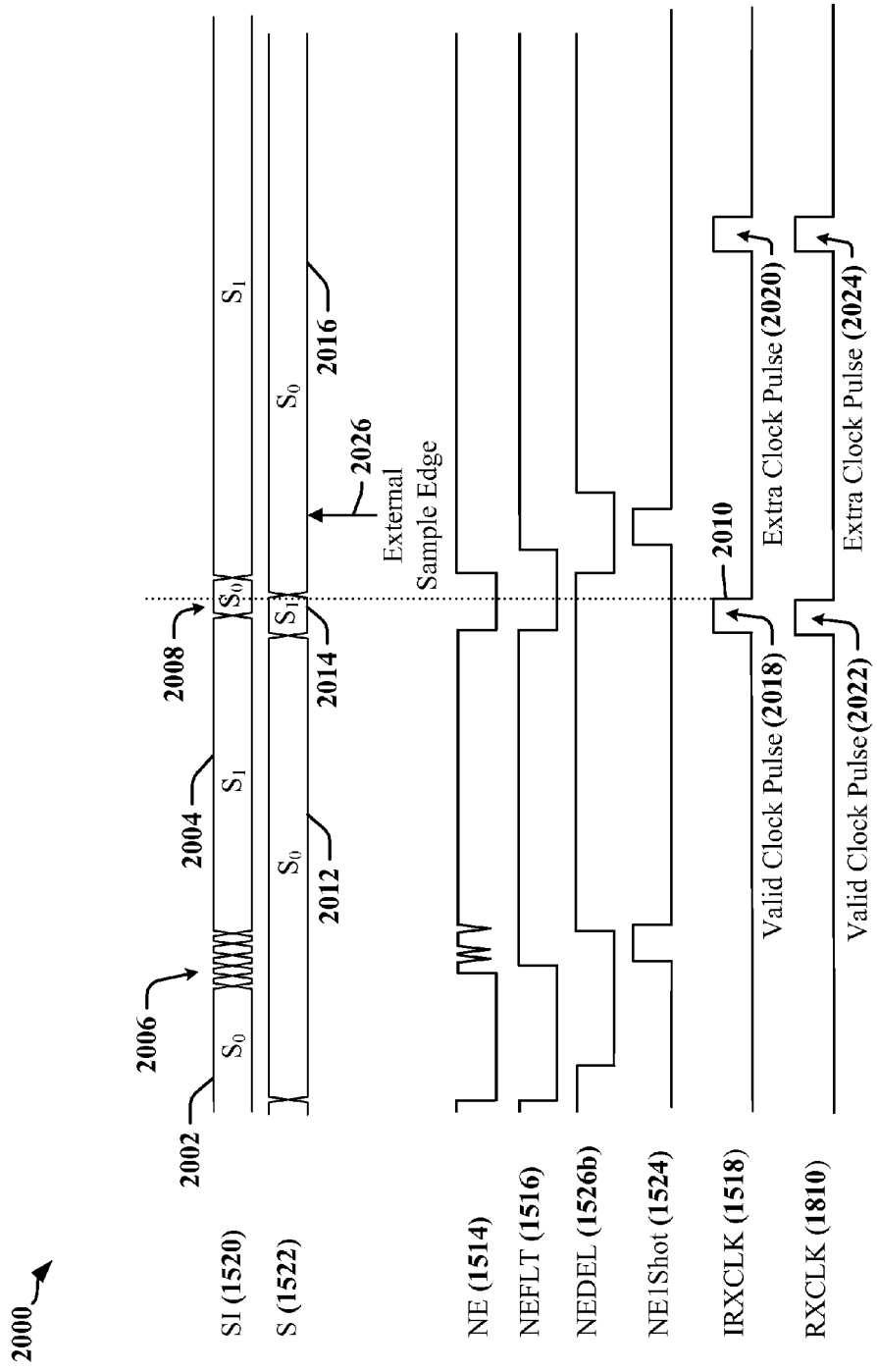
FIGS. 20 and 21 illustrates the generation of additional clock pulses when glitches in received symbols are coincident with a sampling edge.
Figure 21:
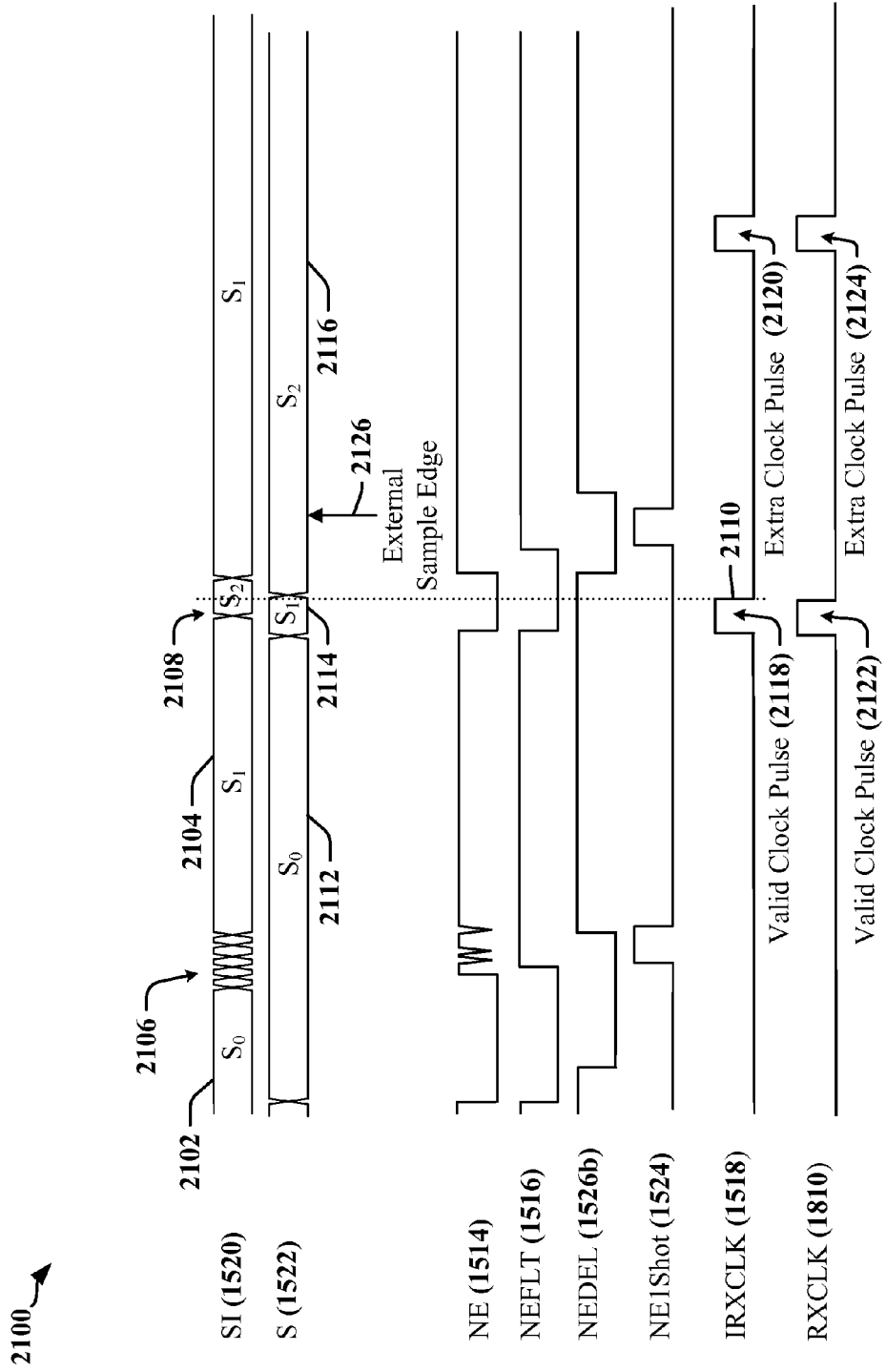

The CDR circuit 1800 of FIG. 18 may remain susceptible to glitches that occur on the signal wires 1508 or in the receiver circuits 1502 when a sampling edge occurs. FIGS. 20 and 21 provide timing diagrams 2000, 2100 that illustrate two scenarios that may cause the generation of additional clock pulses 2024, 2124 in the RXCLK signal 1810.

In FIG. 20, glitches 2008 occur on the SI signal 1520 near the closing edge 2010 of a clock pulse 2018 on the IRXCK signal 1518, where the IRXCK signal 1518 controls the sampling operation of the level latches 1510. The glitches 2008 may cause the SI signal 1520 to return to a value representative of the immediately preceding symbol $S_0$ 2002 from the current symbol $S_1$ 2004 at or before the point of sampling (i.e., closing the level latches 1510), such that the level latches 1510 capture the same symbol value for two symbol intervals 2012, 2016. In operation, an external circuit may sample the latched symbol value at a point in time 2026 defined by a delayed clock based on the RXCLK signal 1810. The occurrence of two identical symbols in consecutive symbol intervals 2012, 2016 may be detected by decoding circuitry such as a symbols-to-transition-number circuit. In addition to a valid pulse 2022 provided on the RXCLK signal 1810, the appearance of the of the $S_0$ symbol value in the second symbol interval 2016 causes the comparator 1504 to drive the NE signal 1514 active after the glitch 2008 is removed from the SI signal 1520 and the SI signal 1520 returns to the $S_1$ symbol value 2004. The transition to an active level on the NE signal 1514 results in the generation of an extra pulse 2020 on the IRXCK signal 1518, and an extra pulse 2024 on the RXCLK signal 1810.

In FIG. 21, glitches 2108 occur on the SI signal 1520 near the closing edge 2110 of a clock pulse 2118 on the IRXCK signal 1518 that controls the level latches 1510.

The glitches 2108 may cause the SI signal 1520 to adopt a value corresponding to a symbol ($S_2$) that is different from the value of the immediately preceding symbol $S_0$ 2102 and from the current symbol St 2104 at the point of sampling (i.e., when the level latches 1510 close), such that the output of the level latches 1510 assumes the $S_2$ symbol value 2116 based on the edge 2110 of the valid pulse 2118 on the RXCLK signal 1810. The presence of the $S_2$ symbol value 2116 on the S signal 1522 may cause the comparator 1504 to drive the NE signal 1514 active after the glitch 2108 is removed from the SI signal 1520 and the SI signal 1520 returns to the $S_1$ symbol value 2104. The transition to the active level on the NE signal 1514 may result in the generation of an extra pulse 2120 on the IRXCK signal 1518, and an extra pulse 2124 on the RXCLK signal 1810. This type of error may not be detected by symbol-to-transition circuitry in the decoder because a symbol transition apparently occurs, although the value detected is incorrect. The decoder may employ other error detection circuits and methods that can detect the error when the data word that contains the error symbol is fully decoded.

Figure 22:
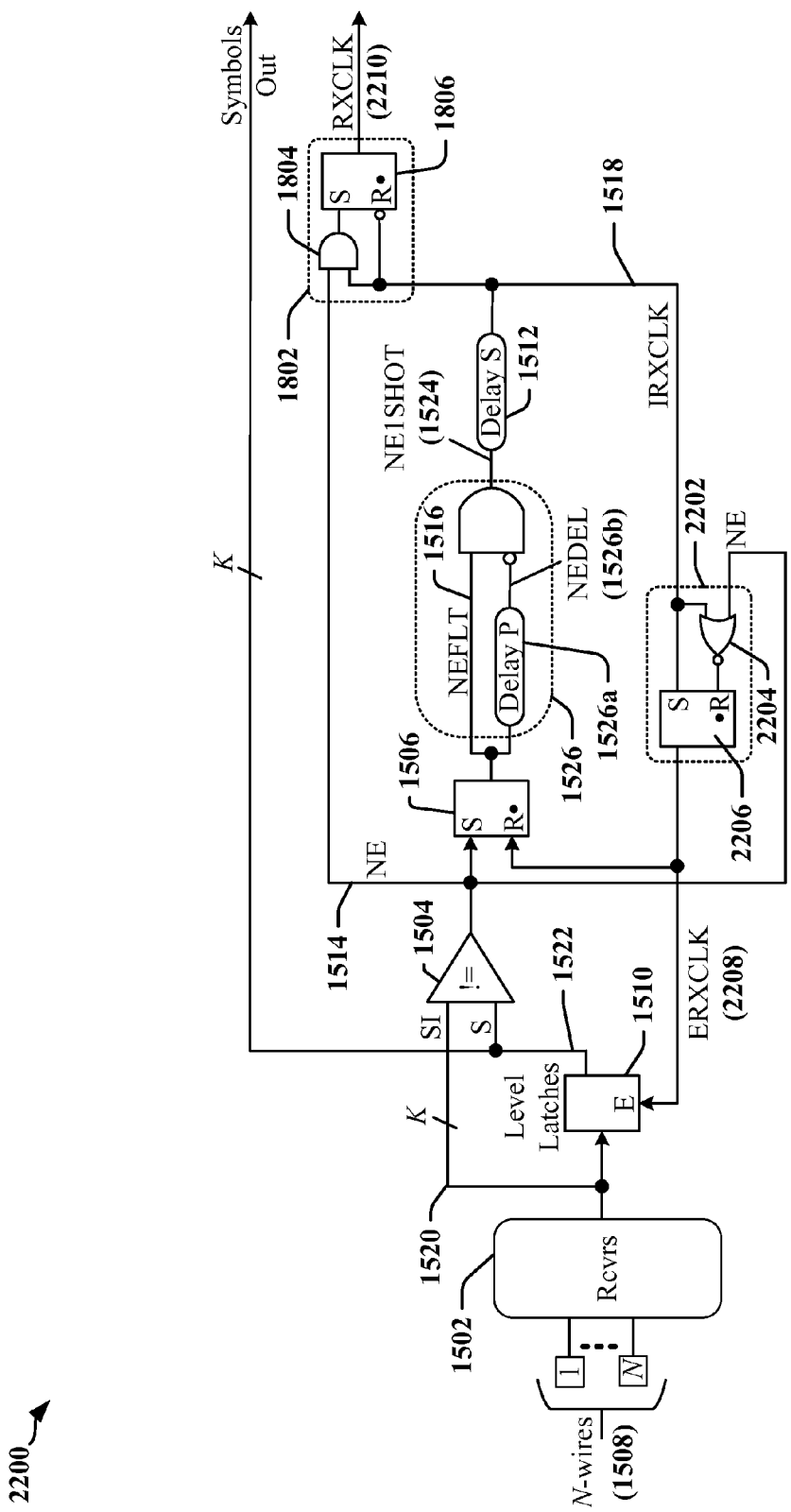
FIG. 22 illustrates a clock and data recovery circuit that includes circuitry that filters additional clock pulses caused by glitches that are coincident with a sampling edge.
Figure 23:
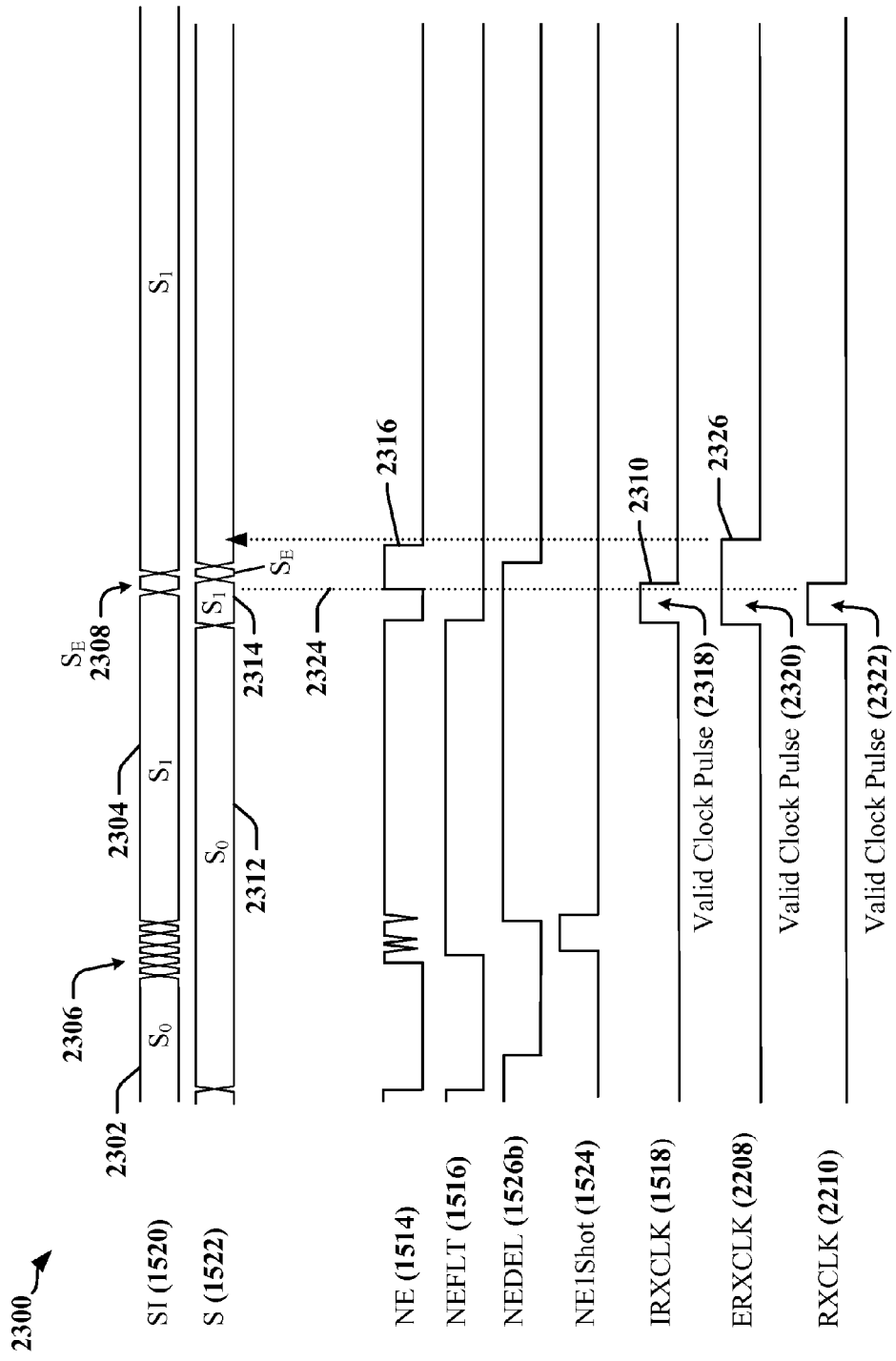
FIG. 23 illustrates timing of certain signals generated by the clock and data recovery circuit of FIG. 22, in accordance with one or more aspects disclosed herein.

FIG. 22 illustrates an example of a CDR circuit 2200 that provides an output clock 2210 that prevents sampling of glitches 2308 that are coincident with a sampling edge 2310 on the IRXCK signal 1518. FIG. 23 illustrates the timing of the CDR circuit 2200. The CDR circuit 2200 includes the CDR circuit 1500 of FIG. 15, the output circuit 1802 of FIG. 18 and an IRXCLK conditioning circuit 2202. The conditioning circuit 2202 generates an extended receive clock (ERXCLK) signal 2208 that includes an extended pulse 2320 corresponding to a valid pulse 2310 on the IRXCK signal 1518. In one example, the level latches 1510 operate in a pass-through mode when the ERXCLK signal 2208 is in a high state and latches the current input value when the ERXCLK signal 2208 falls to the low state.

The extended pulse 2320 is obtained by preventing a falling edge from occurring while the NE signal 1514 is in a high state. The NE signal 1514 and the IRXCK signal 1518 are input to a NOR gate 2204 that drives the reset input of a set-reset latch 2206. The set-reset latch 2206 is set when the IRXCK signal 1518 transitions high. The "Reset" input of the set-reset latch 2206 may be prioritized such that the ERXCLK signal 2208 is reset when the output of the NOR gate 2204 is high, regardless of the state of the IRXCLK signal 1518. The output of the set-reset latch 2206 controls the level latches 1510 and the pulse 2320 is extended until the NE signal 1514 is low, the SI signal 1520 is sampled after any transient conditions on the SI signal 1520 have ended. For example, transient conditions may be observed as an erroneous symbol value ($S_E$) 2308 that is different from the value of the S signal 1522 (here, the $S_1$ symbol). This difference between the SI signal 1520 and the S signal 1522 causes the NE signal 1514 to be asserted (high), which prevents the ERXCLK signal 2208 from falling to the low state.

In the timing example depicted in FIG. 23, a transient condition 2308 causes the SI signal 1520 to transition to an erroneous symbol value for a short period of time (i.e., the $S_E$ pulse 2308). At a time 2324, the NE signal 1514 is asserted to indicate a difference between the state of the SI signal 1520 and the state of the S signal 1522 caused by the presence of the $S_E$ pulse 2308 on the SI signal 1520. Since the ERXCLK signal 2208 is high, the output (S 1522) of the level latches 1510 transitions to reflect the value of the $S_E$ pulse 2308. In the example, the duration of the $S_E$ pulse 2308 is short enough that overlap of the value of the $S_F$ pulse 2308 on the SI signal 1520 and on the S signal 1522 is insufficient to cause the NE signal 1514 to return to a low state. Additionally, in some instances the NOR gate 2204 may be configured to be less responsive to transitions to logic low on the NE signal 1514. The NEFLT signal 1516 is not set by the high level on the NE signal 1514 because the ERXCLK signal remains at logic 1 and is provided to the prioritized Reset function of the S-R latch 1506, thereby causing the NEFLT signal 1516 to remain low.

When both the SI signal 1520 and the S signal 1522 return to the $S_1$ value 2304, 2314, the NE signal 1514 transitions 2316 back to a low logic level. After the low transition 2316 on the NE signal 1514, the S-R latch 2206 is reset, providing a falling edge on the ERXCLK signal 2208 that may be used to latch the current output value (S signal 1522) of the level latches 1510. In some instances, the ERXCLK signal 2208 may be provided to external circuitry for use in sampling symbols from the S signal 1522.

Figure 24:
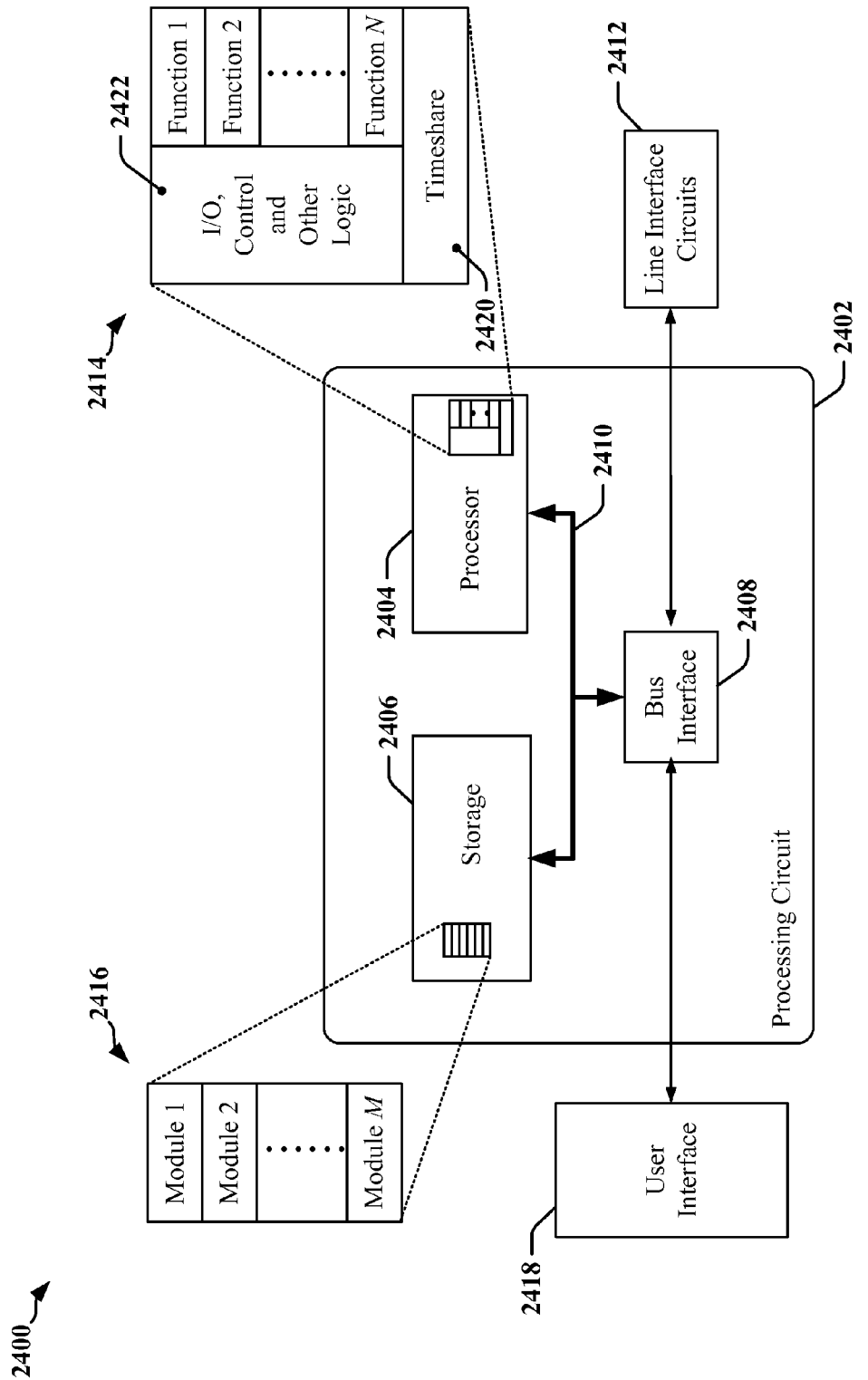
FIG. 24 is a block diagram illustrating an example of an apparatus employing a processing circuit that may be adapted according to certain aspects disclosed herein.

FIG. 24 is a conceptual diagram 2400 illustrating a simplified example of a hardware implementation for an apparatus employing a processing circuit 2402 that may be configured to perform one or more functions disclosed herein. In accordance with various aspects of the disclosure, an element, or any portion of an element, or any combination of elements as disclosed herein may be implemented using the processing circuit 2402. The processing circuit 2402 may include one or more processors 2404 that are controlled by some combination of hardware and software modules. Examples of processors 2404 include microprocessors, microcontrollers, digital signal processors (DSPs), field programmable gate arrays (FPGAs), programmable logic devices (PLDs), state machines, sequencers, gated logic, discrete hardware circuits, and other suitable hardware configured to perform the various functionality described throughout this disclosure. The one or more processors 2404 may include specialized processors that perform specific functions, and that may be configured, augmented or controlled by one of the software modules 2416. The one or more processors 2404 may be configured through a combination of software modules 2416 loaded during initialization, and further configured by loading or unloading one or more software modules 2416 during operation.

In the illustrated example, the processing circuit 2402 may be implemented with a bus architecture, represented generally by the bus 2410. The bus 2410 may include any number of interconnecting buses and bridges depending on the specific application of the processing circuit 2402 and the overall design constraints. The bus 2410 links together various circuits including the one or more processors 2404, and storage 2406. Storage 2406 may include memory devices and mass storage devices, and may be referred to herein as computer-readable media and/or processor-readable media. The bus 2410 may also link various other circuits such as timing sources, timers, peripherals, voltage regulators, and power management circuits. A bus interface 2408 may provide an interface between the bus 2410 and one or more transceivers 2412. A transceiver 2412 may be provided for each networking technology supported by the processing circuit. In some instances, multiple networking technologies may share some or all of the circuitry or processing modules found in a transceiver 2412. Each transceiver 2412 provides a means for communicating with various other apparatus over a transmission medium. Depending upon the nature of the apparatus, a user interface 2418 (e.g., keypad, display, speaker, microphone, joystick) may also be provided, and may be communicatively coupled to the bus 2410 directly or through the bus interface 2408.

A processor 2404 may be responsible for managing the bus 2410 and for general processing that may include the execution of software stored in a computer-readable medium that may include the storage 2406. In this respect, the processing circuit 2402, including the processor 2404, may be used to implement any of the methods, functions and techniques disclosed herein. The storage 2406 may be used for storing data that is manipulated by the processor 2404 when executing software, and the software may be configured to implement any one of the methods disclosed herein.

One or more processors 2404 in the processing circuit 2402 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 2406 or in an external computer readable medium. The external computer-readable medium and/or storage 2406 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium and/or storage 2406 may also include, by way of example, a carrier wave, a transmission line, and any other suitable medium for transmitting software and/or instructions that may be accessed and read by a computer. Computer-readable medium and/or the storage 2406 may reside in the processing circuit 2402, in the processor 2404, external to the processing circuit 2402, or be distributed across multiple entities including the processing circuit 2402. The computer-readable medium and/or storage 2406 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 2406 may maintain software maintained and/or organized in loadable code segments, modules, applications, programs, etc., which may be referred to herein as software modules 2416. Each of the software modules 2416 may include instructions and data that, when installed or loaded on the processing circuit 2402 and executed by the one or more processors 2404, contribute to a run-time image 2414 that controls the operation of the one or more processors 2404. When executed, certain instructions may cause the processing circuit 2402 to perform functions in accordance with certain methods, algorithms and processes described herein.

Some of the software modules 2416 may be loaded during initialization of the processing circuit 2402, and these software modules 2416 may configure the processing circuit 2402 to enable performance of the various functions disclosed herein. For example, some software modules 2416 may configure internal devices and/or logic circuits 2422 of the processor 2404, and may manage access to external devices such as the transceiver 2412, the bus interface 2408, the user interface 2418, timers, mathematical coprocessors, and so on. The software modules 2416 may include a control program and/or an operating system that interacts with interrupt handlers and device drivers, and that controls access to various resources provided by the processing circuit 2402. The resources may include memory, processing time, access to the transceiver 2412, the user interface 2418, and so on.

One or more processors 2404 of the processing circuit 2402 may be multifunctional, whereby some of the software modules 2416 are loaded and configured to perform different functions or different instances of the same function. The one or more processors 2404 may additionally be adapted to manage background tasks initiated in response to inputs from the user interface 2418, the transceiver 2412, and device drivers, for example. To support the performance of multiple functions, the one or more processors 2404 may be configured to provide a multitasking environment, whereby each of a plurality of functions is implemented as a set of tasks serviced by the one or more processors 2404 as needed or desired. In one example, the multitasking environment may be implemented using a timesharing program 2420 that passes control of a processor 2404 between different tasks, whereby each task returns control of the one or more processors 2404 to the timesharing program 2420 upon completion of any outstanding operations and/or in response to an input such as an interrupt. When a task has control of the one or more processors 2404, the processing circuit is effectively specialized for the purposes addressed by the function associated with the controlling task. The timesharing program 2420 may include an operating system, a main loop that transfers control on a round-robin basis, a function that allocates control of the one or more processors 2404 in accordance with a prioritization of the functions, and/or an interrupt driven main loop that responds to external events by providing control of the one or more processors 2404 to a handling function.

Figure 25:
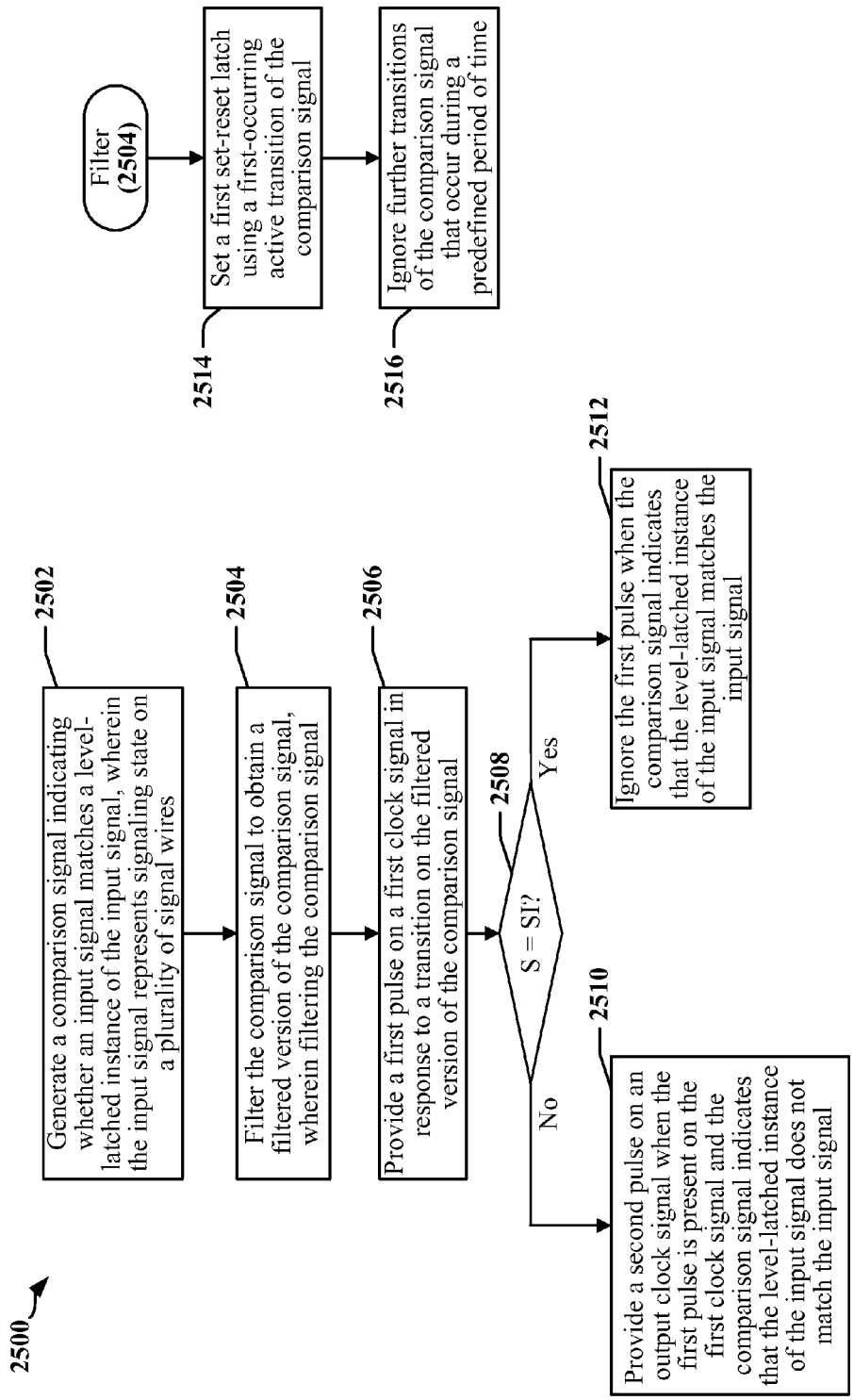
FIG. 25 is a flow chart of a method for recovering a clock signal from signals transmitted on an N-wire communications interface according to certain aspects disclosed herein.

FIG. 25 is a flow chart 2500 of a method for recovering a clock signal from signals transmitted on an N-wire communications interface. Data may be encoded with embedded clock information in sequences of symbols transmitted over the N wires of the N-wire interface.

At block 2502, a comparison signal may be generated. The comparison signal may indicate whether an input signal matches a level-latched instance of the input signal. The input signal may represent signaling state on a plurality of signal wires.

At block 2504, the comparison signal may be filtered to obtain a filtered version of the comparison signal.

In one example, the filtering of block 2504 may include setting 2514 a first set-reset latch using a first-occurring active transition of the comparison signal, and ignoring 2516 further transitions of the comparison signal that occur during a predefined period of time.

At block 2506, a first pulse may be provided on a first clock signal in response to a transition on the filtered version of the comparison signal. The first pulse may be provided on the first clock signal by generating a third pulse having a predetermined duration in response to a transition on the filtered version of the comparison signal, and delaying the third pulse to obtain the first pulse. The first pulse may reset the first set-reset latch. The first pulse may be used to trigger a level latch that receives the input signal and outputs the level-latched instance of the input signal.

At block 2508, it may be determined whether a level-latched instance (S) of the input signal does not match the input signal (SI). If a match exists, then the method proceeds at block 2512, and the method proceeds at block 2510 if the level-latched instance of the input signal does not match the input signal.

At block 2510, a second pulse may be provided on an output clock signal when the first pulse is present on the first clock signal and the comparison signal indicates that the level-latched instance of the input signal does not match the input signal.

At block 2512, the first pulse may be ignored when the comparison signal indicates that the level-latched instance of the input signal matches the input signal.

In some examples, data words may be encoded in sequences of symbols transmitted on the plurality of signal wires. Clock information may be embedded in transitions between symbols in the sequences of symbols.

In one example, the plurality of signal wires includes at least three signal wires. Each combination of two wires in the at least three signal wires may be driven by a differential driver that is different from differential drivers that drive other available combinations of two wires in the at least three signal wires.

In some instances, providing a second pulse on an output clock signal includes setting a second set-reset latch when the first pulse is present on the first clock signal and the comparison signal indicates that the level-latched instance of the input signal does not match the input signal, and resetting the second set-reset latch when no pulse is present on the first clock signal.

In some instances, an extended instance of the first pulse may be generated when the first pulse occurs while the comparison signal indicates that the input signal does not match the level-latched instance of the input signal. The level-latched instance of the input signal may be updated to match the input signal by capturing the input signal using the extended instance of the first pulse. The extended instance of the first pulse may be extended until the comparison signal indicates that the input signal matches the level-latched instance of the input signal. The level-latched instance of the input signal may be updated by using the extended instance of the first pulse to trigger a level latch that receives the input signal and outputs the level-latched instance of the input signal.

Figure 26:
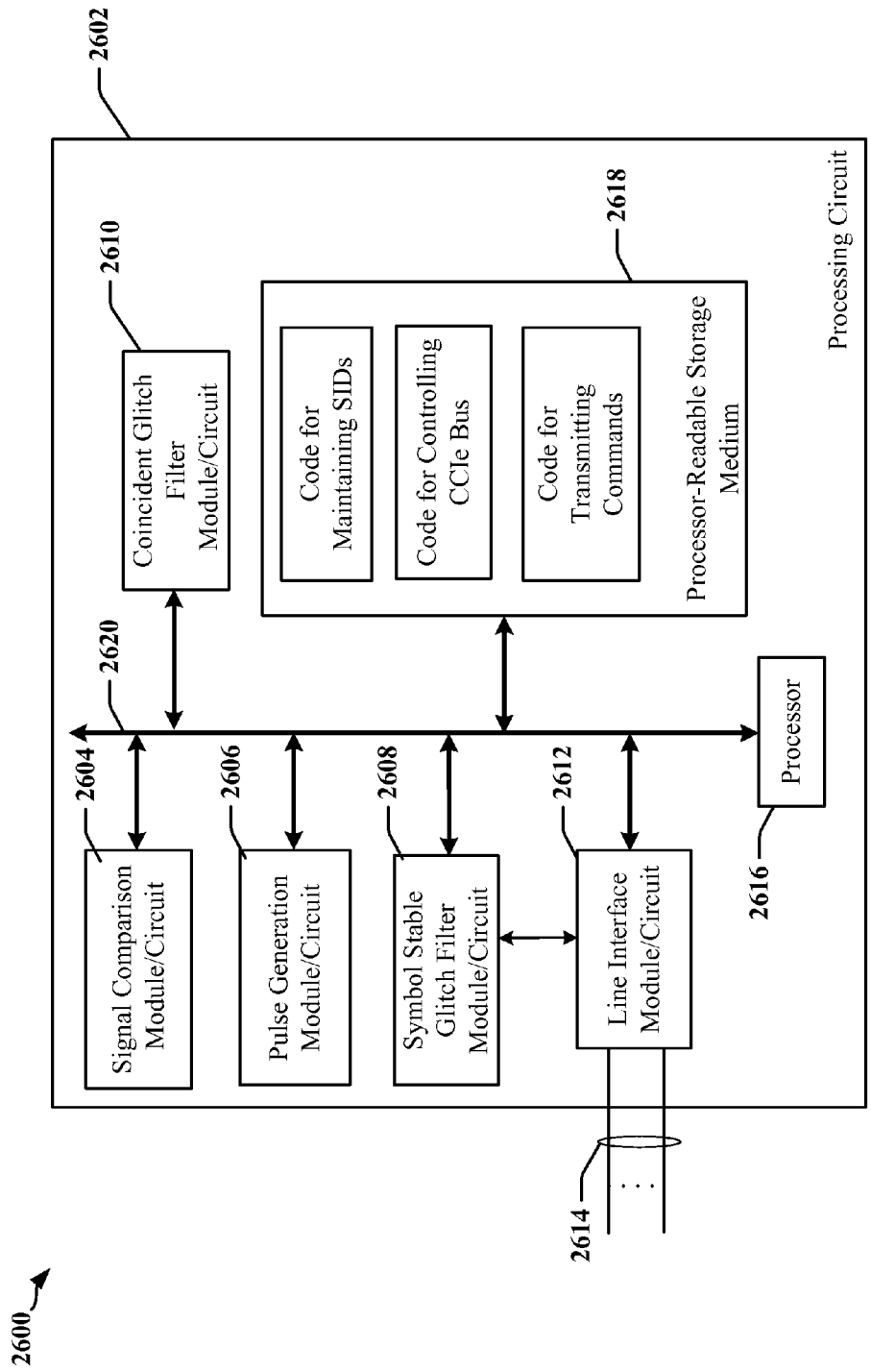
FIG. 26 is a diagram illustrating an example of a hardware implementation for an apparatus employing a processing employing a processing circuit adapted according to certain aspects disclosed herein.

FIG. 26 is a diagram illustrating a simplified example of a hardware implementation for an apparatus 2600 employing a processing circuit 2602. The processing circuit typically has a processor 2616 that may include one or more of a microprocessor, microcontroller, digital signal processor, a sequencer and a state machine. The processing circuit 2602 may be implemented with a bus architecture, represented generally by the bus 2620. The bus 2620 may include any number of interconnecting buses and bridges depending on the specific application of the processing circuit 2602 and the overall design constraints. The bus 2620 links together various circuits including one or more processors and/or hardware modules, represented by the processor 2616, the modules or circuits 2604, 2606, 2608, and 2610, line interface circuits 2612 configurable to communicate over connectors or wires 2614 and the computer-readable storage medium 2618. The bus 2620 may also link various other circuits such as timing sources, peripherals, voltage regulators, and power management circuits, which are well known in the art, and therefore, will not be described any further.

The processor 2616 is responsible for general processing, including the execution of software stored on the computer-readable storage medium 2616. The software, when executed by the processor 2616, causes the processing circuit 2602 to perform the various functions described supra for any particular apparatus. The computer-readable storage medium 2618 may also be used for storing data that is manipulated by the processor 2616 when executing software, including data decoded from symbols transmitted over the connectors 2614. The processing circuit 2602 further includes at least one of the modules 2604, 2606, 2608, and 2610. The modules 2604, 2606, 2608, and 2610 may be software modules running in the processor 2616, resident/stored in the computer readable storage medium 2618, one or more hardware modules coupled to the processor 2616, or some combination thereof. The modules 2604, 2606, 2608, and/or 2610 may include microcontroller instructions, state machine configuration parameters, or some combination thereof.

In one configuration, the apparatus 2600 for wireless communication includes modules and/or circuits 2604 for generating a comparison signal indicating whether an input signal matches a level-latched instance of the input signal that represents signaling state on a plurality of signal wires, modules and/or circuits 2606 for providing a first pulse on a first clock signal in response to a transition on a filtered version of the comparison signal, modules and/or circuits 2608 for providing a second pulse on an output clock signal that filters extra clocks caused by glitches in the input signal. In some instances, the apparatus 2600 includes modules and/or circuits 2610 for extending the first pulse and for filtering extra clocks caused by glitches in the input signal that coincide with a sampling edge used to capture a current input symbol.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A clock recovery circuit, comprising:
    a comparator configured to provide a comparison signal indicating whether an input signal matches a level-latched instance of the input signal, wherein the input signal represents signaling state on a plurality of signal wires;
    a first set-reset latch that provides a filtered version of the comparison signal, wherein the first set-reset latch is set by a first-occurring active transition of the comparison signal and is unaffected by further transitions of the comparison signal that occur during a predefined period of time;
    delay circuitry that receives the filtered version of the comparison signal and outputs a first pulse on a first clock signal; and
    a second set-reset latch configured to provide a second pulse on an output clock signal when the first pulse is present on the first clock signal and the comparison signal indicates that the level-latched instance of the input signal does not match the input signal,
    wherein the second set-reset latch is reset when no pulse is present on the first clock signal.

2. The clock recovery circuit of claim 1, wherein data words are encoded in sequences of symbols transmitted on the plurality of signal wires, and wherein clock information is embedded in transitions between symbols in the sequences of symbols.

3. The clock recovery circuit of claim 2, wherein the plurality of signal wires comprises at least three signal wires, and wherein each combination of two wires in the at least three signal wires is driven by a differential driver that is different from differential drivers that drive other available combinations of two wires in the at least three signal wires.

4. The clock recovery circuit of claim 1, wherein the second set-reset latch is configured to ignore pulses on the first clock signal that occur when the comparison signal indicates that the level-latched instance of the input signal matches the input signal.

5. The clock recovery circuit of claim 1, wherein the first pulse resets the first set-reset latch.

6. The clock recovery circuit of claim 1, further comprising:
    a third set-reset latch configured to produce an extendable pulse on a third clock signal, wherein the extendable pulse is derived from the first pulse and is extended when the first pulse occurs while the comparison signal indicates that the input signal does not match the level-latched instance of the input signal.

7. The clock recovery circuit of claim 6, wherein the extendable pulse is extended until the comparison signal indicates that the input signal matches the level-latched instance of the input signal.

8. The clock recovery circuit of claim 6, further comprising:
    a level latch that receives the input signal and outputs the level-latched instance of the input signal, where the level latch is triggered by the extendable pulse.

9. The clock recovery circuit of claim 1, further comprising:
    a level latch that receives the input signal and outputs the level-latched instance of the input signal, where the level latch is triggered by the first pulse.

10. The clock recovery circuit of claim 1, wherein the delay circuitry comprises:
    one-shot logic that generates a third pulse in response to a transition on the filtered version of the comparison signal; and
    a delay element that delays the third pulse to obtain the first pulse.

11. A method for recovering a clock signal, comprising:
    providing an input and a level-latched instance of the input signal to a comparator, wherein the comparator is configured to generate a comparison signal indicating whether an input signal matches a level-latched instance of the input signal, wherein the input signal represents signaling state on a plurality of signal wires;
    filtering the comparison signal to obtain a filtered version of the comparison signal, wherein filtering the comparison signal includes:
        setting a first set-reset latch using a first-occurring active transition of the comparison signal; and
        ignoring further transitions of the comparison signal that occur during a predefined period of time;
    providing a first pulse on a first clock signal in response to a transition on the filtered version of the comparison signal;
    providing a second pulse on an output clock signal when the first pulse is present on the first clock signal and the comparison signal indicates that the level-latched instance of the input signal does not match the input signal; and
    ignoring the first pulse when the comparison signal indicates that the level-latched instance of the input signal matches the input signal.

12. The method of claim 11, wherein data words are encoded in sequences of symbols transmitted on the plurality of signal wires, and wherein clock information is embedded in transitions between symbols in the sequences of symbols.

13. The method of claim 12, wherein the plurality of signal wires comprises at least three signal wires, and wherein each combination of two wires in the at least three signal wires is driven by a differential driver that is different from differential drivers that drive other available combinations of two wires in the at least three signal wires.

14. The method of claim 11, wherein providing a second pulse on an output clock signal comprises:
    setting a second set-reset latch when the first pulse is present on the first clock signal and the comparison signal indicates that the level-latched instance of the input signal does not match the input signal; and
    resetting the second set-reset latch when no pulse is present on the first clock signal.

15. The method of claim 11, wherein the first pulse resets the first set-reset latch.

16. The method of claim 11, further comprising:
    generating an extended instance of the first pulse when the first pulse occurs while the comparison signal indicates that the input signal does not match the level-latched instance of the input signal; and
    updating the level-latched instance of the input signal to match the input signal by capturing the input signal using the extended instance of the first pulse.

17. The method of claim 16, wherein the extended instance of the first pulse is extended until the comparison signal indicates that the input signal matches the level-latched instance of the input signal.

18. The method of claim 16, wherein updating the level-latched instance of the input signal comprises:

using the extended instance of the first pulse to trigger a level latch that receives the input signal and outputs the level-latched instance of the input signal.

19. The method of claim 11, further comprising:
using the first pulse to trigger a level latch that receives the input signal and outputs the level-latched instance of the input signal.

20. The method of claim 11, wherein providing the first pulse on the first clock signal comprises:
generating a third pulse having a predetermined duration in response to a transition on the filtered version of the comparison signal; and
delaying the third pulse to obtain the first pulse.

21. An apparatus for recovering clock information from a multi-wire communications interface, comprising:
means for generating a comparison signal indicating whether an input signal matches a level-latched instance of the input signal, wherein the input signal represents signaling state on a plurality of signal wires;
means for filtering the comparison signal to obtain a filtered version of the comparison signal, wherein means for filtering the comparison signal is configured to:
set a first set-reset latch using a first-occurring active transition of the comparison signal; and
ignore further transitions of the comparison signal that occur during a predefined period of time;
means for providing a first pulse on a first clock signal in response to a transition on the filtered version of the comparison signal;
means for providing a second pulse on an output clock signal when the first pulse is present on the first clock signal and the comparison signal indicates that the level-latched instance of the input signal does not match the input signal; and
means for ignoring the first pulse when the comparison signal indicates that the level-latched instance of the input signal matches the input signal.

22. The apparatus of claim 21, wherein data words are encoded in sequences of symbols transmitted on the plurality of signal wires, and wherein clock information is embedded in transitions between symbols in the sequences of symbols.

23. The apparatus of claim 22, wherein the plurality of signal wires comprises at least three signal wires, and wherein each combination of two wires in the at least three signal wires is driven by a differential driver that is different from differential drivers that drive other available combinations of two wires in the at least three signal wires.

24. The apparatus of claim 21, wherein the means for providing a second pulse on an output clock signal is configured to:
set a second set-reset latch when the first pulse is present on the first clock signal and the comparison signal indicates that the level-latched instance of the input signal does not match the input signal; and
reset the second set-reset latch when no pulse is present on the first clock signal.

25. The apparatus of claim 21, wherein the first pulse resets the first set-reset latch.

26. The apparatus of claim 21, further comprising:
means for generating an extended instance of the first pulse when the first pulse occurs while the comparison signal indicates that the input signal does not match the level-latched instance of the input signal; and
means for updating the level-latched instance of the input signal to match the input signal by capturing the input signal using the extended instance of the first pulse.

27. The apparatus of claim 26, wherein the extended instance of the first pulse is extended until the comparison signal indicates that the input signal matches the level-latched instance of the input signal.

28. The apparatus of claim 26, further comprising:
a level latch adapted to receive the input signal and output the level-latched instance of the input signal,
wherein the means for updating the level-latched instance of the input signal is configured to use the extended instance of the first pulse to trigger the level latch.

29. The apparatus of claim 21, further comprising:
a level-latch that receives the input signal and outputs the level-latched instance of the input signal, wherein the level latch is triggered using the first pulse.

30. The apparatus of claim 21, wherein the means for providing the first pulse on the first clock signal is configured to:
generate a third pulse having a predetermined duration in response to a transition on the filtered version of the comparison signal; and
delay the third pulse to obtain the first pulse.

* * * * *